United States Patent
LaComb et al.

(10) Patent No.: US 11,658,453 B2
(45) Date of Patent: May 23, 2023

(54) CONCENTRIC CYLINDRICAL CIRCUMFERENTIAL LASER

(71) Applicants: Ronald LaComb, West Greenwich, RI (US); Kevin LaComb, Haddam, CT (US)

(72) Inventors: Ronald LaComb, West Greenwich, RI (US); Kevin LaComb, Haddam, CT (US)

(*) Notice: Subject to any disclaimer, the term of this patent is extended or adjusted under 35 U.S.C. 154(b) by 47 days.

(21) Appl. No.: 17/103,470

(22) Filed: Nov. 24, 2020

(65) Prior Publication Data

US 2021/0104861 A1 Apr. 8, 2021

Related U.S. Application Data

(63) Continuation-in-part of application No. 16/252,928, filed on Jan. 21, 2019, now abandoned.
(Continued)

(51) Int. Cl.
*H01S 3/083* (2006.01)
*H01S 3/06* (2006.01)
(Continued)

(52) U.S. Cl.
CPC ............ *H01S 3/083* (2013.01); *H01S 3/0627* (2013.01); *H01S 3/0675* (2013.01);
(Continued)

(58) Field of Classification Search
CPC .. H01S 5/1071; H01S 5/1075; H01S 5/04254; H01S 5/4031; H01S 5/4043;
(Continued)

(56) References Cited

U.S. PATENT DOCUMENTS 3,725,809 A * 4/1973 Ulrich .................. G02B 6/1245
    372/7
3,969,687 A * 7/1976 Freiberg ................ H01S 3/0818
    372/66
(Continued)

FOREIGN PATENT DOCUMENTS

CN 101878568 B * 3/2012 ............. B82Y 20/00
CN 104662750 A * 5/2015 ............. B82Y 20/00
(Continued)

*Primary Examiner* — Joshua King
(74) *Attorney, Agent, or Firm* — Young Basile Hanlon & MacFarlane, P.C.

(57) ABSTRACT

The present disclosure relates to a three-dimensional cylindrical cavity-type laser system capable of supporting circumferential radial emission. A cylindrical ring waveguide provides optical confinement in the radial and axial dimensions thereby supporting a plurality of radial modes, one of a plurality of axial modes and a plurality of degenerate azimuthal modes. These modes constitute a set of traveling wave modes which propagate around the cylindrical ring waveguide possessing various degrees of optical confinement as quantified by their respective Q-factors. Index tailoring is used to tailor the radial refractive index profile and geometry of the waveguide to support radial modes possessing Q-factors capable of producing efficient radial emission, while gain tailoring is used to define a gain confining region which offsets modal gain factors of the modal constituency to favor a preferred set of modes supporting efficient radial emission out of the total modal constituency supported by the resonator. Under appropriate pump actuation the selected modes produce circumferential laser radiation with the output surface comprising of the entire outer perimeter of the cylindrical ring waveguide. The design is applicable toward both micro-resonators and resonators much larger than the optical wavelength, enabling high output powers and scalability. The circumferential
(Continued)

radial laser emission can be concentrated by positioning the cylindrical ring laser inside a three-dimensional conical mirror thereby forming a laser ring of light propagating in the axial dimension away from the surface of the laser, which can be subsequently collimated for focused using conventional optics.

40 Claims, 13 Drawing Sheets

Related U.S. Application Data

(60) Provisional application No. 62/623,476, filed on Jan. 29, 2018.

(51) Int. Cl.
| | | |
|---|---|---|
| *H01S 3/067* | (2006.01) | |
| *H01S 3/0941* | (2006.01) | |
| *H01S 5/40* | (2006.01) | |
| *H01S 5/10* | (2021.01) | |
| *H01S 5/02255* | (2021.01) | |
| *H01S 5/042* | (2006.01) | |
| *H01S 5/22* | (2006.01) | |
| *H01S 5/12* | (2021.01) | |
| *H01S 5/20* | (2006.01) | |
| *H01S 5/42* | (2006.01) | |
| *H01S 5/185* | (2021.01) | |

(52) U.S. Cl.
CPC .......... *H01S 3/0941* (2013.01); *H01S 5/1075* (2013.01); *H01S 5/4056* (2013.01); *H01S 5/02255* (2021.01); *H01S 5/04254* (2019.08); *H01S 5/04256* (2019.08); *H01S 5/12* (2013.01); *H01S 5/185* (2021.01); *H01S 5/204* (2013.01); *H01S 5/2219* (2013.01); *H01S 5/4075* (2013.01); *H01S 5/42* (2013.01)

(58) Field of Classification Search
CPC .... H01S 5/185; H01S 5/4075; H01S 5/02255; H01S 5/42
See application file for complete search history.

(56) References Cited

U.S. PATENT DOCUMENTS

| | | | | | |
|---|---|---|---|---|---|
| 5,115,284 | A | * | 5/1992 | Kawasaki | H01L 33/24 372/50.1 |
| 5,327,448 | A | * | 7/1994 | Holonyak, Jr. | H01L 21/31666 385/14 |
| 5,434,426 | A | * | 7/1995 | Furuyama | G02B 6/43 250/214 LS |
| 5,548,610 | A | * | 8/1996 | Bouadma | H01S 5/18 372/99 |
| 5,703,896 | A | * | 12/1997 | Pankove | B82Y 20/00 372/50.23 |
| 6,044,098 | A | * | 3/2000 | Sun | H01S 5/227 372/46.013 |
| 6,256,330 | B1 | * | 7/2001 | LaComb | H01S 5/20 372/45.01 |
| 6,577,661 | B1 | * | 6/2003 | Wang | H01S 5/1071 372/45.01 |
| 7,502,405 | B2 | * | 3/2009 | Tan | H01S 5/1071 438/46 |
| 9,246,300 | B2 | | 1/2016 | LaComb | |
| 11,056,856 | B2 | * | 7/2021 | Mauthe | H01S 5/1042 |
| 2002/0024980 | A1 | * | 2/2002 | Kwon | H01S 5/1075 372/45.01 |
| 2002/0080842 | A1 | * | 6/2002 | An | H01S 3/0627 372/92 |
| 2002/0126713 | A1 | * | 9/2002 | Ibanescu | G02B 6/02261 372/6 |
| 2004/0247008 | A1 | * | 12/2004 | Scheuer | G02B 6/12007 372/94 |
| 2006/0110839 | A1 | * | 5/2006 | Dawson | H01S 5/1075 438/22 |
| 2006/0227842 | A1 | * | 10/2006 | Townsend | H01S 3/0602 372/69 |
| 2007/0081569 | A1 | * | 4/2007 | Kwon | B82Y 20/00 372/43.01 |
| 2007/0201796 | A1 | * | 8/2007 | Guide | G02B 6/12007 385/39 |
| 2010/0091370 | A1 | * | 4/2010 | Mahrt | G02B 5/1876 359/574 |
| 2010/0265977 | A1 | * | 10/2010 | Kwon | H01S 5/34333 372/45.01 |
| 2011/0080931 | A1 | * | 4/2011 | Tredicucci | G02B 6/12007 372/45.01 |
| 2013/0221223 | A1 | * | 8/2013 | Caneau | H01S 5/32 250/340 |
| 2013/0322475 | A1 | * | 12/2013 | LaComb | H01S 3/08 372/99 |
| 2015/0214425 | A1 | * | 7/2015 | Taylor | H01L 27/085 257/14 |
| 2017/0047462 | A1 | * | 2/2017 | Ishigaki | H02J 1/00 |
| 2017/0104313 | A1 | * | 4/2017 | Cujia Pena | H01S 5/423 |
| 2018/0152002 | A1 | * | 5/2018 | Ebbecke | H01S 5/0234 |

FOREIGN PATENT DOCUMENTS

| | | | | |
|---|---|---|---|---|
| CN | 105186288 A | * | 12/2015 | |
| CN | 105204169 A | * | 12/2015 | |
| DE | 10039435 A1 | * | 2/2002 | .......... H01L 33/145 |
| FR | 2909806 A1 | * | 6/2008 | .......... H01S 3/0604 |
| WO | WO-9320581 A1 | * | 10/1993 | ....... H01L 21/02178 |
| WO | 2015/133936 A1 | | 9/2015 | |
| WO | WO-2015133936 A1 | * | 9/2015 | ................ F21V 9/30 |

\* cited by examiner

Cross section

Cross section

Cross section

Cross section

Cross section

Cross section S1

CONCENTRIC CYLINDRICAL CIRCUMFERENTIAL LASER

APPLICATION CROSS-REFERENCE

This application claims the benefit of U.S. Provisional Application No. 62/623,476 filed on Jan. 29, 2018, the entirety of which is incorporated herein by reference. This application is also a continuation-in-part of U.S. patent application Ser. No. 16/252,928, filed on Jan. 21, 2019, the entirety of which is herein incorporated by reference.

BACKGROUND

Technical Field

Embodiments of the invention generally fall into the category of a laser apparatus and method of generating a laser beam. In some embodiments there is a cylindrical or circular resonator with a means of mode tailoring utilizing both index of refraction tailoring and gain tailoring to constitute and excite a set of radially emitting modes exiting the resonator along the circumference. In still other embodiments, the circumferential laser emission is directed via three-dimensional reflectors or equivalent structures to image and/or concentrate the laser emission. More specifically, embodiments of the present invention relate to a means for increasing the lasing aperture and scaling of the radial mode area to scale the average output power.

Discussion of Art

Background

A laser consists of an optical resonator, an optically active gain media housed within the resonator and a pump source to produce photon generation within the resonator. Laser threshold is reached when the small signal round trip gain equals the resonator losses. The main function of the optical resonator is to impart a modal structure and shape to the energy emitted by a laser and to provide positive optical feedback to promote stimulated emission of photons within a defined modal set. Losses within the optical resonator can vary significantly from one mode to another. Modal losses are characterized by their Q-factor which is defined as the ratio of energy stored to power dissipated per unit angular frequency w. In general, high Q modes within a laser resonator supporting a plurality of modes are first to be amplified within a laser resonator and eat up the available gain effectively starving the lower Q modes supported by the resonator.

In general, a laser requires a gain loaded resonator or cavity enabling optical circulation and amplification. In general, different types of laser resonators are used depending upon the laser type, common resonator types can include linear open resonators and reflecting waveguide types both of which can be configured in linear or ring type geometries. Open resonators are typically formed by two or more mirrors separated by an expanse containing a gain media and are categorized as stable or unstable cavities.

Another type of resonator, a cavity resonator, confines the radiation in three dimensions, causing standing waves in all three dimensions (x, y, and z axes). The number of supported modes M over a frequency interval of $\omega+\Delta\omega$ is proportional to the resonator volume V multiplied by $\omega^2$. The use of cavity resonators for optical frequencies is typically limited to micro-resonators with the volume of the cavity on the order of the wavelength $\lambda^3$ (i.e., cavity dimensions ranging from 1-100$\lambda$). Use of optical cavity resonators for V>$\lambda^3$ is not practical as the separation between resonances, i.e. the ratio of $\Delta M/\omega$ decreases with frequency, while spectral line $\omega/Q$ increases with frequency. Therefore, typical optical cavity resonators (with optical frequencies defined to encompass electromagnetic radiation with wavelengths in the range of 10 nm to 1000 μm or frequencies ranging from 300 GHz to 3000 THz) with volumes greater than the wavelength support a very large number of modes with overlapping spectral lines which cause the resonator to lose its resonance properties. Optical cavity resonators are therefore limited to micro-cavity resonators with geometries on order with the optical wavelength (1-100$\lambda$), exceeding this criterion causes optical cavity resonators to lose their resonant properties, limiting micro-cavity type laser resonators to very low power applications.

Open resonators differ from a cavity resonator in two aspects: First, the transverse resonator sidewalls are removed while the longitudinal "end face" reflectors are retained. Second, the dimensions of the resonator are much larger than the optical wavelength $\lambda$. The open resonator geometry enables only the modes propagating along the resonator axis (or deviating slightly) to be excited, thereby significantly reducing the number of modes supported by the cavity, therefore, open resonators maintain their resonant characteristics at optical wavelengths for geometries much larger than the optical wavelength. Open type laser resonators support the formation of laser beam outputs, for the modal intensity profiles determine the laser-mode geometry (not the resonator geometry) ultimately limiting the laser aperture and power scalability.

Conventional ring lasers or traveling-wave lasers are based upon two classes of open resonators, waveguide-based resonators and free-space open resonators. Free space open resonator ring lasers employ three or more mirrors to create traveling waves rotating clockwise and counterclockwise around the resonator, a partial reflective mirror is typically used for an output coupler allowing a portion of the laser beam to exit the resonator.

Conventional traveling wave lasers use waveguides to form a ring or racetrack architecture. Micro-disk lasers (with geometries on order of 1-100 times the optical wavelength $\lambda$) consist of laser resonators of geometric size on the order of the operational wavelength typically in the form a disk or toroid. Since traveling wave disk resonators are a form of cavity resonator, their geometries are limited to micro-resonators. As disk diameters become much larger than the operational wavelength the energy separation between modes becomes so small that the resonator cannot differentiate between different wavelengths and therefore loses its resonator behavior. This requirement restricts conventional traveling wave disk laser geometries to diameters on the order of 10-100 microns.

Micro-ring lasers utilize a substrate waveguide (semiconductor, polymer or other) formed into a circular geometry in the shape of a disk or ring with diameters on the order of the wavelength. The resulting modes are in general Whispering Gallery Modes (characterized by very high Q-factors). The laser radiation is of the traveling type, and typically harnessed by evanescent-coupling waveguides to the rings or by incorporating optical gratings to instill vertical emission. Due to the small volume of the micro-cavity, output powers are small; often less than a mW. Other types of micro-ring resonators include: racetrack, ring, toroid, fiber optic, bottle type, spherical, and cylindrical geometries all of which typically utilize whispering gallery mode (WGM) resonators coated with an active media (quantum dots or a thin coating of optically active media) to achieve lasing. These waveguides are also micro-resonators with waveguides designed to trap the light around the circumference of the cylinder, sphere, toroid or other circular geometry, which typically limit their application to relatively low output powers less than 10 mW.

A cavity resonator provides three-dimensional optical confinement and sets up orthogonal modes in each dimensional constraint. Consider a rectangular cavity resonator with optically reflective walls, with the dimension of the resonator (d×d×L), with d the dimension in the x and y coordinate and L the length in z, boundary conditions for standing waves substantiate a set of modes with wavevectors given by:

$$k_x, k_y = \frac{\pi m}{d}, \frac{\pi n}{d}, k_z = \frac{\pi q}{L}, \quad (1)$$

Where m, n and q are mode indices. The wavevector is related to the wavelength λ, by k=2π/λ the resonant wavelength $\lambda_{m,n,q}$ is given by:

$$\lambda_{m,n,q} = \sqrt{\left(\frac{m}{2d}\right)^2 + \left(\frac{n}{2d}\right)^2 + \left(\frac{mq}{2L}\right)^2}. \quad (2)$$

where the frequency and wavelength are related by λf=c, and Δλ/λ=Δf/f=Δω/ω. As the dimensions of the cavity grow, the separation in resonant wavelengths and corresponding frequencies decreases as the number of modes increases. For a given resonator cavity volume V, the number of plane waves taken over the interval from ω(2πf) to ω+Δω is proportional to ω², with the number of modes M approximated by $$M \approx \omega^2 V \Delta\omega. \quad (3)$$

The Q factor of the resonator is defined as the ratio of energy stored in the resonator to the energy lost by the resonator per unit time, given by:

$$Q = \omega\tau = \frac{\omega}{\Delta\omega_r} \quad (4)$$

Where τ is the decay constant of the radiation also defined as the average photon lifetime in the resonator and $\Delta\omega_r$ is the spectral linewidth of the resonator. This expression reflects the relation between the Q factor of a resonator and the inherent losses (which include mirror and material losses which determine laser threshold).

Thus, as shown above the spectral line width (separation between the centers of spectral lines) condenses as the frequency is increased (consider Δω/M≈1/ω²). This limits microcavities to geometric lengths of 1-100λ as at larger cavity sizes the resonator loses the resonant function. Thus, for resonators with geometries much larger than the optical wavelength (L>100λ) the number of modes (M) increases to a level such that the spectral lines of the resonator overlap and thus the resonator loses its resonance properties. This relegates lasers based upon cavity resonators to the micro-resonator regime.

An et al. in U.S. Pat. App. Pub. No: 2002/0080842 A1 ("An") illustrates an example evanescent-wave coupled circularly symmetric microcavity laser. The microcavity resonators disclosed by An function by evanescently coupling gain to whispering gallery modes (WGM) supported by microcavity resonators that employ a gain media inherently localized outside the microcavity resonator. An further provides for large scale integration of microdisks or microcylinder laser resonators, not large scale cavity lasers.

Evanescent-wave-coupling in this context refers to providing photonic amplification to the tail of the WGM. WGM are high Q modes which occupy a highly localized region of a circular resonator located along the outside edge of the resonator (microcavity in this context). The WGM tail extents slightly outside the resonator, by providing an optical gain media outside the microcavity, optical amplification of the WGM can be achieved provided the WGM tail overlaps with the external gain media. The device structure taught by An employs circular microcavities for generation of WGMs, with cavities limited in dimension to radii extending from 1-100λ, in line with typical microcavity resonators. Thus, the device of An is not capable of operating at a scale out of the microcavity regime.

Although light emitting diodes (LED) rely upon similar mathematical principles and materials to generate photon emissions, they are not equivalent to laser devices. In particular, LEDs lack optical resonance and purely directional emission inherent in a single emitter. For example, Shreter et al. in Int. Pat. App. Pub. No: WO2015/133936 A1 ("Shreter") discloses a laser array consisting of multi-element laser diodes arranged in series on an axis of symmetry. Although termed a "laser diode," these devices are only named thus in that they refer to their potential use to pump lasing media. Indeed, Shreter refers to the diode devices as laser diode devices comprising disc optical resonators capable of emitting radiation with the axis of symmetry coinciding with the axis of the symmetry of the light-emitting device, limiting their invention to micro-cavity architectures, for cavity resonators lose their resonant properties for geometrics larger than the micro-cavity regime. Shreter further does not address scaling of laser emitting devices to geometries exceeding the geometries associated with micro-cavity regime.

Shreter further teaches an assembly architecture for axially symmetric laser bar array formation while limiting the application to array assembly of conventionally available circularly symmetric semiconductor photonic emitters supporting radial emission. Shreter also teaches the assembly of an array of conventional circularly symmetric light emitting elements capable of emitting light perpendicular to an axis of symmetry, with each element in electrical and mechanical contact to form a bar array architecture with each individual emitting element of coinciding axis of symmetry. Shreter cites as possible light emitting elements laser diodes and other electrically actuated light emitting devices based upon cylindrically symmetric cavity type resonators including disk resonators, hollow optical resonators, ring optical resonators or polygonal optical resonators. Conventional electrically actuated photonic devices based upon cylindrically symmetric cavity-type laser resonator architectures are limited to micro-cavity designs with volumes on the order of the optical wavelength as discussed above. Shreter does not discuss modification to existing conventional cylindrically symmetric light emitting devices capable of light emission perpendicular to the axis of symmetry, but cites many patents pertaining to electrical actuated cavity type laser resonators including: quantum ring laser diodes, whispering mode micro-resonators and nano-wire arrays as possible elemental laser sources for bar array assemblies.

However, Shreter does not address any design considerations, integration strategies, or scaling techniques of the elemental light emitting device design. Instead, Shreter limits instruction to assembly of laser diode arrays formed by positioning multiple individual conventional cavity-type laser diode resonators about a common axis of symmetry, with possible element candidates limited to conventional laser architectures which are limited to micro-cavity geometries (as above discussed).

Additional embodiments disclosed by Shreter utilize the photons emitted from the emitter array to stimulate a phosphor, producing a secondary photonic emission. Thus, instead of a concentric directional emission from a single source emitter, Shreter relies on the arrangement of multiple individual emission devices electrically connected in series and configured in an axially symmetric assembly to produce a combined radiation pattern. For an individual photon emitter, Shreter is silent to the degree of coherency of the emitted light or design aspects pertaining to geometric scaling of cavity resonators to achieve coherent or quasi-coherent radiation commensurate with laser action. Further, as Shreter is absent of any design discussion relating to elemental photon emitters, including optically pumped solid-state laser emitters, his application is limited to bar assembly of conventional electronically actuated photonic sources capable of radial emission which are limited to: light emitting diodes "LEDs" or very low power micro-cavity lasers), and WGM type devices which are all inherently low power elements due to their small cavity volume. Furthermore, Shreter teaches bar assembly based upon the arrangement of individual light emitting elements positioned along a central axis, no instruction is provided to redesign the individual light emitting elements to possess a common core or discuss arrays with concentric architectures nor address geometric scaling of the individual light emitting elements.

Thus, as above described, the vast majority of high power laser systems utilize the open resonator concept where a resonator is used to amplify light between two end mirrors, creating a laser beam exiting from one of the mirrors configured as an output coupler. Traveling wave resonators employ open resonator configurations consisting of three or more mirrors, or cavity-type resonators in the shape of micro-rings or micro-disk geometries. Also, lasers in general are designed to produce uniform output beams with minimum distortions due to thermal gradients or saturation effects. However, power limitations associated with the above designs are often associated with beam width and beam quality degradation or component failure, particularly when scaling to larger volumes or adapting to different geometries. These metrics often depend upon dependencies of modal constituency on resonator volume and power handling limitations of mirrors or other laser components establishing a tradeoff between beam quality and beam power. Typically, as the resonator volume is increased, the resonator modal constituency is altered causing a degradation in beam quality. Further, increasing the power without increasing the resonator volume can cause thermal degradation or catastrophic optical mirror damage (COD) at the output facet or coupler when power thresholds are exceeded. Accordingly, there exists a need for further improvements in laser systems toward power scalability and beam quality, which can be accomplished by utilizing gain and index tailoring to favor amplification of a subset of modes supporting efficient radial emission from the large modal constituency supported by cylindrical cavity optical resonators of geometries much greater than the wavelength, enabling geometric scaling of laser resonator volume and laser aperture.

BRIEF SUMMARY OF THE INVENTION

This section provides a general summary of the disclosure and is not a comprehensive disclosure of its full scope or all of its features.

In one embodiment of the invention a laser apparatus comprising a cylindrical ring optical resonator is provided. A gain media is housed within the resonator with at least one pump source. A gain confining region established by the overlap of the pump source and gain media is configured to limit optical gain in the radial, axial and azimuthal dimensions within the resonator. The cylindrical ring optical resonator is further configured to support a plurality of radial and azimuthal modes and one or more axial modes. The pump source is configured to overlap with the gain media to generate photons within the gain confining region. The gain confining region is further limited in radial extent with an inner radius greater than or equal to an inner radius of the cylindrical ring resonator and an outer radius substantially less than an outer radius of the cylindrical ring resonator. Finally, the cylindrical ring resonator is configured to favor amplification of a subset of modes supporting circumferential radiative emission in the radial direction. The circumferential laser radiation can be redirected away from the surface of the laser element by a three-dimensional mirror or other reflective/guiding surface and subsequently concentrated or collimated by external optical lens components.

In another embodiment of the invention a method of making a laser apparatus is provided. A cylindrical ring optical resonator is formed in a semiconductor by etching a cylindrical ring ridge-waveguide into the epitaxial layers of a semiconductor laser diode device capable of supporting a plurality of radial modes with degenerate azimuthal modes. The epitaxial layers consist of n-type and p-type layers with a central active layer forming both an electrical diode structure and axial waveguide supporting at least one axial mode with significant overlap with the active layer. Electrical contacts are made to contact the p-type layers and n-type lasers and to allow for a forward applied bias supporting a current which injects carriers into the active layer which recombined radiatively producing laser action. A current confining mechanism is used to spatially define carrier injection into the active layer thereby establishing a gain confining region in the radial, azimuthal and axial dimension which overlaps substantially with a preferred set of modes supporting efficient radial emission while gain-starving the remainder of the modal constituency supported by the laser resonator.

In another embodiment of the invention a method of making a laser apparatus is provided. A cylindrical ring optical resonator is formed in a solid-state laser media by creating a composite cylindrical structure with radial index profile producing a cylindrical ring waveguide supporting a plurality of radial modes with degenerate azimuthal modes. The cylindrical waveguide region houses a gain media consisting of a Rare-Earth doped media. An optical pump source overlaps with the gain media to produce a gain confining region in the radial, azimuthal and axial dimension, capable of producing laser action. The gain confining region overlaps substantially with a preferred set of modes supporting efficient radial emission while gain-starving the remainder of the modal constituency supported by the laser resonator.

In another embodiment of the invention a multi-element laser array is formed by making two or more cylindrical ring laser resonators about a common core with each laser element of a larger diameter configured concentrically about a central region. Three dimensional reflectors are utilized to concentrate the radial emission.

In another embodiment of the invention a multi-element laser array is formed by making two or more cylindrical ring laser resonators with each laser element stacked in the axial dimension about a common core. Three dimensional reflectors are utilized to concentrate the radial emission.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

The drawings described herein are for illustrative purposes only of selected embodiments and not all possible implementations and are not intended to limit the scope of the present disclosure. The accompanying drawings, which are incorporated into and constitute a part of the specification, illustrate specific embodiments of the apparatus, systems, and methods and, together with the general description given, and the detailed description of specific embodiments serve to explain the principles of the apparatus, systems, and methods. In the drawings.

DETAILED DESCRIPTION OF THE INVENTION

Figure 1A:
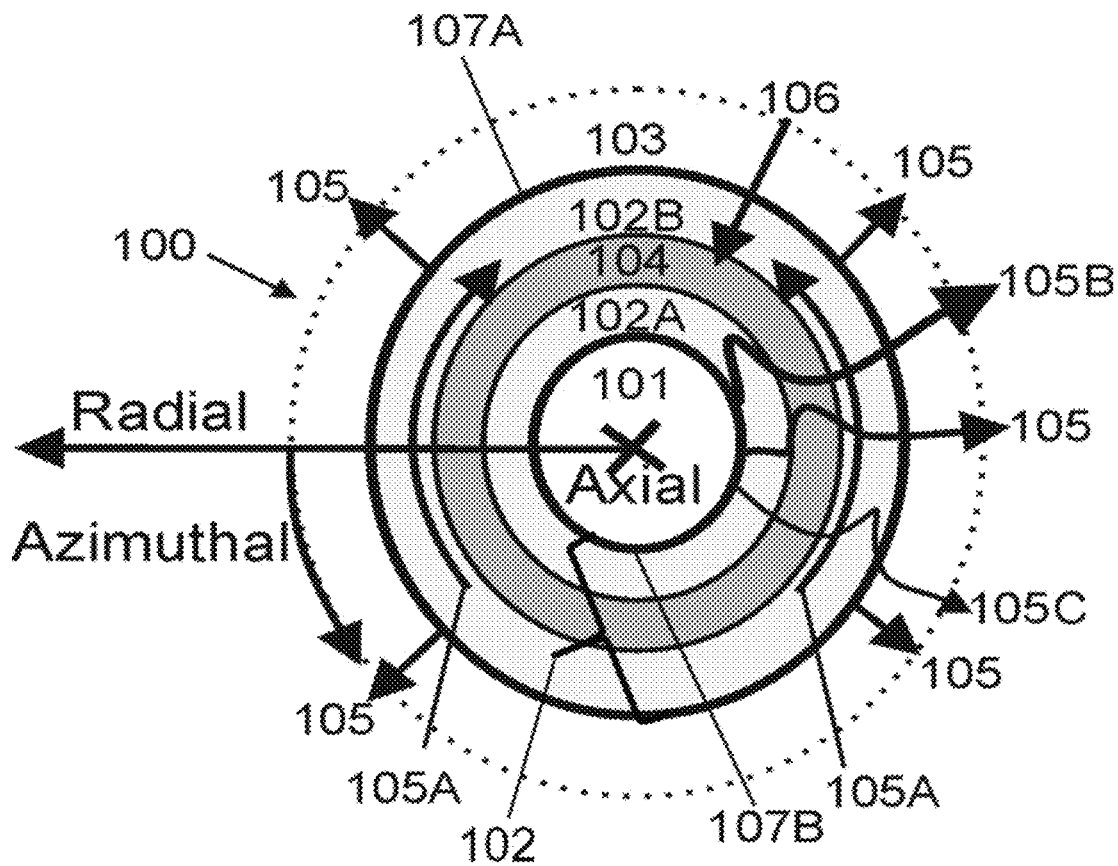
FIG. 1A shows a high-level overhead view schematic diagram of one example of a cylindrical ring laser in accordance with an embodiment of the present invention.

As above noted, microcavity lasers, such as those of the type disclosed by An, are restricted to dimensions ranging from a few tens of microns to a few hundreds of microns and are not scalable to larger volumes. The method of optical amplification disclosed by An further restricts volume scaling due to reliance on an external optical source located outside the resonator, evanescently coupled to WGMs supported by the microresonator. Thus, as shown above, the laser architecture disclosed by An is further limited in volume to geometric extents on order with the optical wavelength, and coupled with the absence of gain media within the resonator, no connection can be made to resonator scaling to volumes greater than the optical wavelength. Thus, An cannot achieve scalability to large scale resonators on the order of several inches or greater with high power radial radiative laser emission.

Also, as above noted, Shreter discloses assembly techniques to form bar arrays of individual conventional diode-based laser source elements supporting radial emission arranged about a common axis of symmetry. The application of Shreter is limited to the assembly of individual microresonator type devices and is absent any instruction regarding the design of the individual light emitting elements to address scalability or integration about a common core. Further, Shreter does not include any discussion of bar assembly of optically pumped solid-state emitters, integration strategy to form multiple emitters about a common core (which could greatly improve thermal dissipation and lifetime) nor laser arrays with concentric architectures.

Power scaling of conventional laser architectures are limited by thermal and power density limitations of materials making up the laser systems, attempts at power scaling by increasing the resonator volume leads to degradation in beam quality, due to the onset of additional modes running in the laser. In semiconductor lasers, power is often limited by facet failure while solid state lasers are often limited by thermal fracture limits. An object of this invention is to provide a new type of laser employing a gain and index tailored cylindrical ring resonator capable of circumferential radial emission. Such a laser enables geometric power scaling with consistent beam performance. Embodiments of the resonators disclosed herein allow cylindrical ring cavities to serve as optical resonators at geometries much larger than the wavelength supported by gain media housed inside the waveguide. Through index tailoring of the radial index profile of the cylindrical ring waveguide, similar radial mode constituencies can be supported for cylindrical waveguides of increasing diameters. This is accomplished by tailoring the change in index of refraction step between the cylindrical ring waveguide region and the interior and exterior regions for a given cylindrical ring waveguide width (similar to defining the change in index between the fiber core and cladding of a step index optical fiber for a given core diameter). Gain tailoring is utilized to favor a select subset of modes out of the total modal constituency thereby reducing the overall number of active modes to those which support sufficient radial laser emission, thereby increasing laser efficiency and aperture while enabling volumetric scaling of cavity type laser resonators.

A cylindrical ring laser resonator in accordance with an embodiment of the invention is designed to support a set of traveling wave modes consisting of a plurality of radial modes, one or more of a plurality of axial modes and a plurality of degenerate azimuthal modes propagating in both the clockwise and counterclockwise directions around the cylindrical ring waveguide with varying degrees of confinement as defined by their respective Q-factors. By tailoring the radial variation of the index of refraction cylindrical ring resonators can be designed to support a set of radial modes varying in Q-factor from high Q-factor Whispering Gallery modes to radial modes with lower Q-factors supporting significant radial emission.

Modal analysis of example embodiments of cylindrical ring laser resonators demonstrate that radial modes with significant intensity profiles at inner radii are attributed to lower Q-factor modes while high Q-factor modes possess radial intensity profiles concentrated at the outer radius of the cylindrical ring waveguide. Through proper index tailoring (tailoring the cylindrical ring width, and index profile), the interior radial modes can be designed to support intermediate Q-factors capable of efficient radial emission for a large variation in cavity volumes.

Gain tailoring is employed to offset the gain provided to a subset of radial modes with selected Q-factors over that of the high Q-factor modes (known as Whispering Gallery Modes), by establishing a gain confining region (defined as the region where the gain media is excited by a pump source) which substantially overlaps with a desired set of radial modes. Gain tailoring effectively reduces the number of active modes allowing cylindrical ring cavity type resonators to maintain resonant properties for large geometries at optical wavelengths. Gain tailoring is accomplished by confining the radial extent of gain amplification to lower radii of the cylindrical ring waveguide which overlap substantially with the selected Q-factor modes while gain starving high Q-factor modes which have intensity profiles concentrated at the outer radius of the cylindrical resonator.

By utilizing both index and gain tailoring, cylindrical ring laser resonators in accordance with embodiments of the present invention can scale in diameter while maintaining similar laser modal constituency while maintaining efficient radial emission when pump actuation exceeds threshold levels. Operational modes are characterized as traveling wave modes circulating around the cylindrical ring resonator radiating energy as they propagate, the integrated radiation loss incurred in one revolution is analogous to mirror loss in a standing wave laser resonator. Laser threshold is met when the optical gain of a particular mode matches the round-trip modal loss, consisting of the mirror loss and any material loss present in the waveguide. The output mirror for this type of novel laser resonator extends around the entire circumference of the cylindrical ring resonator.

Circumferential radial emission increases output power for acceptable levels of power density and thermal density by spreading out the beam energy around the cylindrical ring waveguide. Beam quality is maintained for cylindrical ring waveguides of larger diameter and associated cavity volume for all modes are radial. For semiconductor lasers COD (catastrophic optical damage) is significantly mitigated for the entire circumference of the outer cylindrical ring constitutes the output laser coupler, enabling much higher powers to be achieved before reaching failure levels. For solid state lasers the thermal breakdown often causing gain media fracturing or modal degradation can be mitigated, by the larger modal volumes supported thereby enabling power scaling. In certain embodiments, the radial emission is harnessed by a three-dimensional mirror designed to redirect the radial laser emission. Alternatively, in other embodiments, the cylindrical ring waveguide can be designed to support lower Q-factor modes, or pumped below threshold, thereby supporting predominantly spontaneous light generation, producing a LED instead of laser diode.

A mode tailored spherical laser and gain and index tailored single mode semiconductor lasers are described in U.S. Pat. Nos. 9,246,300 and 6,256,330 (both incorporated herein by reference). In both of the cited patents gain and index tailoring are utilized to select a subset of modes from a larger modal constituency supported by laser resonators to optimize laser performance and scaling. Widely employed in the semiconductor laser field this technique includes the following device designs: Broaden Waveguide Semiconductor Diode Lasers, Separate Confinement Heterostructure (SCH) Laser Diode, and Large Optical Cavity Semiconductor Lasers. These designs employ gain and index tailoring to optimize modal confinement of single mode laser performance. For a spherical laser, gain and index tailoring is applied to spherical three-dimensional laser resonators to maintain their resonator properties for diameters much larger that the optical wavelength. In gain and index tailored single mode semiconductor lasers, gain and index tailoring is applied to rectangular waveguides to make multi-mode ridge waveguide resonators function as single mode laser resonators.

In each case cited, employment of gain and index tailoring is utilized to select a preferred set of optical modes from a larger modal constituency supported by an optical resonator. Each resonator type requires unique resonator design constraints specific to their geometry, modal intensity profiles and fabrication technology establishing a unique design criterion. Embodiments of the present invention pertain to cylindrical waveguide resonators much larger in geometry than the support optical wavelength classified as cavity type resonators. Cavity type resonators much larger than the optical wavelength are not capable of producing optical resonators as the number of optical modes supported by a cavity type is so great that the frequency spacing between the support modes becomes infinitesimal resulting in a loss of resonator properties. To overcome this restraint knowledge of the mathematical description of the modal constituency (described by cylindrical Bessel functions in the radial direction and Hermite Gaussian function in the axial dimension) and laser resonator theory is used in concert with gain and index tailoring, which are all specific to the cylindrical resonator geometry to produce cylindrical ring laser resonators capable of efficient circumferential radial emission at diameters much greater than the optical wavelength.

Example embodiments will now be described more fully with reference to the accompanying drawings.

Referring to the drawings, to the following detailed description, and to incorporated materials, detailed information about the apparatus, systems, and methods is provided including the description of specific embodiments. The detailed description serves to explain the principles of the apparatus, systems, and methods described herein. The apparatus, systems, and methods described herein are susceptible to modifications and alternative forms. The application is not limited to the particular forms disclosed. The application covers all modifications, equivalents, and alternatives falling within the spirit and scope of the apparatus, systems, and methods as defined by the claims.

The present invention includes a cylindrical ring optical resonator providing radial and axial optical confinement, thereby supporting a set of radial and axial modes with degenerate azimuthal modes, a gain confining region defined by the overlap of a pump source and optical active media for offsetting modal confinement factors favoring a lasing modal constituency consisting of a limited radial, azimuthal and axial modal set possessing Q-factors which support efficient radial emission around the circumference of the device. The multi-layered gain tailored resonator design allows cylindrical ring laser resonators to maintain optical resonator functionality over a wide range of cylindrical diameters (diameters ranging from µm diameters to hundreds of mm to inches and beyond) far exceeding the optical wavelength, while supporting circumferential laser emission exiting about a 360-degree output mirror surface. This enables power scaling beyond what is achievable utilizing conventional laser architectures.

Referring to FIG. 1A, a schematic is shown illustrating a top down view of a cylindrical ring laser 100 including a cylindrical ring waveguide capable of supporting a plurality of traveling wave type modes 105A comprising radial, azimuthal and axial components. The radial cylindrical ring waveguide is formed by media 101, 102 and 103, with central media 102 consisting of inner region 102A, an outer region 102B and a gain confining region 104 all possessing higher refractive index than that of the inner region 101 and outer region 103.

The radial extent of the cylindrical ring waveguide spans from an inner radius with surface 107B located at the radial intersection of regions 101 and 102A to an outer radius with surface 107A located at the radial intersection of region 102B and 103. Surface 107A forms an output mirror or output coupler surface extending in the axial dimension to allow the circulating modes 105A to radiate energy 105 as prescribed by their respective Q factor. The radial dependency of the modal intensity of three classes of radial modes (Whispering Gallery Modes "WGM" 105C with high Q-factors and low radiation losses, intermediate Q-factor modes 105 with higher radiation losses and lower Q-factor modes 105B with the highest radiation losses) supported by the cylindrical ring resonator are illustrated as a function of their respective Q-factors.

High Q-factor modes (Whispering Gallery Modes 105C) have intensity profiles located along the outside circumference of the cylindrical ring waveguide in region 102B have low radiation losses, lower Q-factor modes have intensity profiles peaking at lower radii with the lowest Q-factor modes 105B supporting intensity peaks near the inner radius of the cylindrical ring waveguide just outside surface 107B. A set of select radial modes with intermediate Q-factors 105 are favored for lasing by designing the gain confining region to overlap more substantially with these selected radial modes, thereby offsetting their respective radial modal confinement factors over that of higher or lower Q-factor modes. The supported radial modes travel around the cylindrical ring resonator occupying radial space as indicated, with varying radial emission components as defined by their respective Q value. Index tailoring of the cylindrical ring waveguide includes tailoring the refractive index difference between region and the overall resonator geometry to create a cylindrical ring waveguide capable of confining a plurality of radial modes including a preferred select set of radial modes with intermediate Q-factors which support efficient radial emission.

Media 102 contains an optical gain media capable of producing optical gain when actuated by one or more pump sources 106. The overlap of the optical gain region and modal profile determines the modal confinement factor and modal gain of a particular mode set. The pump source 106 can be of the form of a current source or one or more independent optical sources including free space lasers and fiber coupled lasers. The overlap of the pump source 106 and gain media form a gain confining region 104 located within the central region 102 of the cylindrical ring waveguide. The overlap of the gain confining region 104 with the various radial mode intensity profiles determines the individual modal gains of the radial modes supported by the cylindrical ring resonator. By restricting the gain confining region to an annular and or azimuthal region overlapping with the radial mode intensity profiles of preferred 105 selected Q-factor modes, efficient radial emission can be achieved.

FIG. 1A further illustrates placement of the gain confining region 104 to overlap substantially more with the intensity profile of intermediate Q radial modes 105 over that of lower Q 105B or higher Q 105A radial modes thereby favoring lasing of a preferred set of radial modes with intermediate Q factors 105 which support efficient radial emission. Lasing is achieved when the modal gain of the preferred set of modes meets or exceed the roundtrip cavity loss.

The cylindrical ring laser resonator can also be tailored for efficient circumferential laser radiation or as a light emitting diode depending upon the level of actuation and the tailored modal constituency. The emission efficiency can also be optimized by including optical coatings at surfaces 107A and 107B. Power scaling is accomplished by increasing the overall diameter of the cylindrical waveguide while maintaining a proportionate ring waveguide annular width, and tailoring the radial refractive index profile to produce a similar radial modal constituency, thus enabling an increase in total output radial power for fixed power and thermal densities within the resonator and at the output mirror.

Figure 1B:
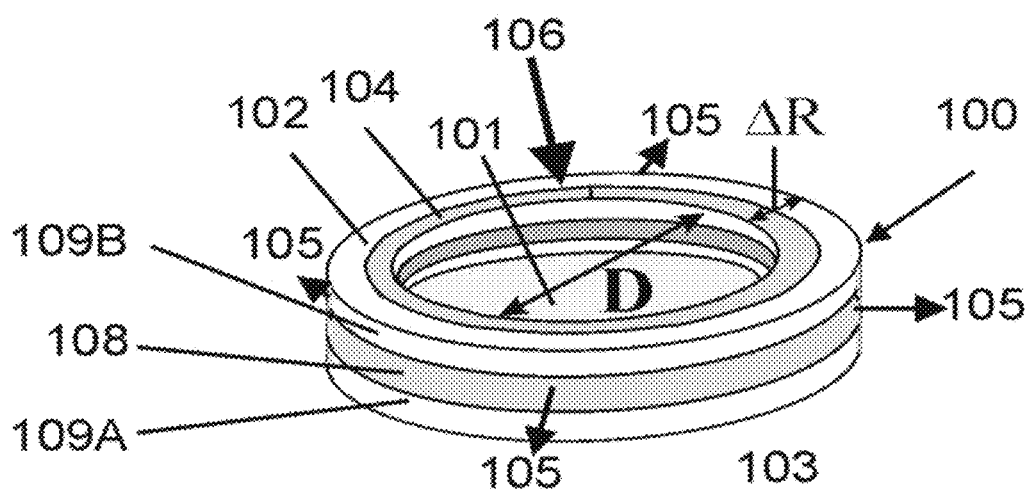
FIG. 1B shows a simplified offset view of a three-dimensional drawing of a cylindrical ring laser in accordance with an embodiment of the present invention.

Turning to FIG. 1B, there is illustrated an offset three dimensional view of a cylindrical ring laser 100 according to an embodiment of the invention with cylindrical ring waveguide formed by regions 101, 102 and 103 (air in this case), with region 102 containing an optical gain media capable of producing optical gain when actuated by a pump source 106. The cylindrical ring waveguide has as with inner diameter D, ring waveguide width $\Delta R$, with the index of refraction of region 102 greater that of regions 101 and 103 thereby forming a radial waveguide capable of supporting a plurality of radial modes, furthermore, with the index of refraction of region 108 greater than that of regions 109A and 109B forming an axial waveguide supporting at least one axial mode with an intensity peak in region 108. A gain confining region 104 located within region 102 and 108 is established by the overlap of the pump source 106 and gain media to offset the radial modal gain to favor a set of preferred radial modes supporting efficient radial emission 105.

Figure 2A:
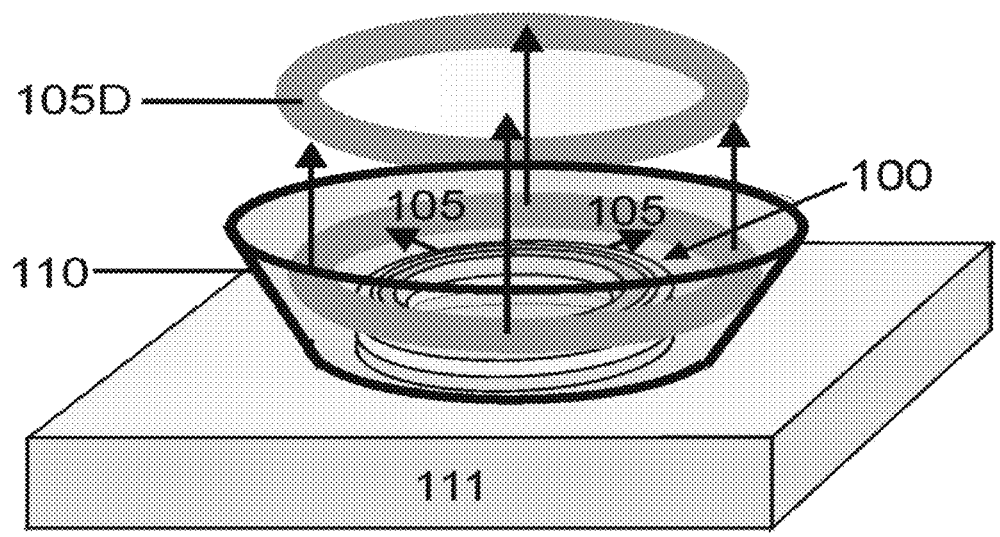
FIG. 2A shows an offset view schematic of a cylindrical ring laser positioned within a three-dimensional reflector to redirect the circumferential laser emission in the axial dimension in accordance with an embodiment of the present invention.

Referring to FIG. 2A a cylindrical ring laser 100 is shown capable of producing circumferential laser radiation 105 in accordance with an embodiment of the present invention, positioned with a three-dimensional reflective mirror 110 redirecting the resultant ring of laser radiation 105D vertically away from the laser surface. Furthermore, the laser is positioned on a heat conducting plate 111 for heat removal.

Figure 2B:
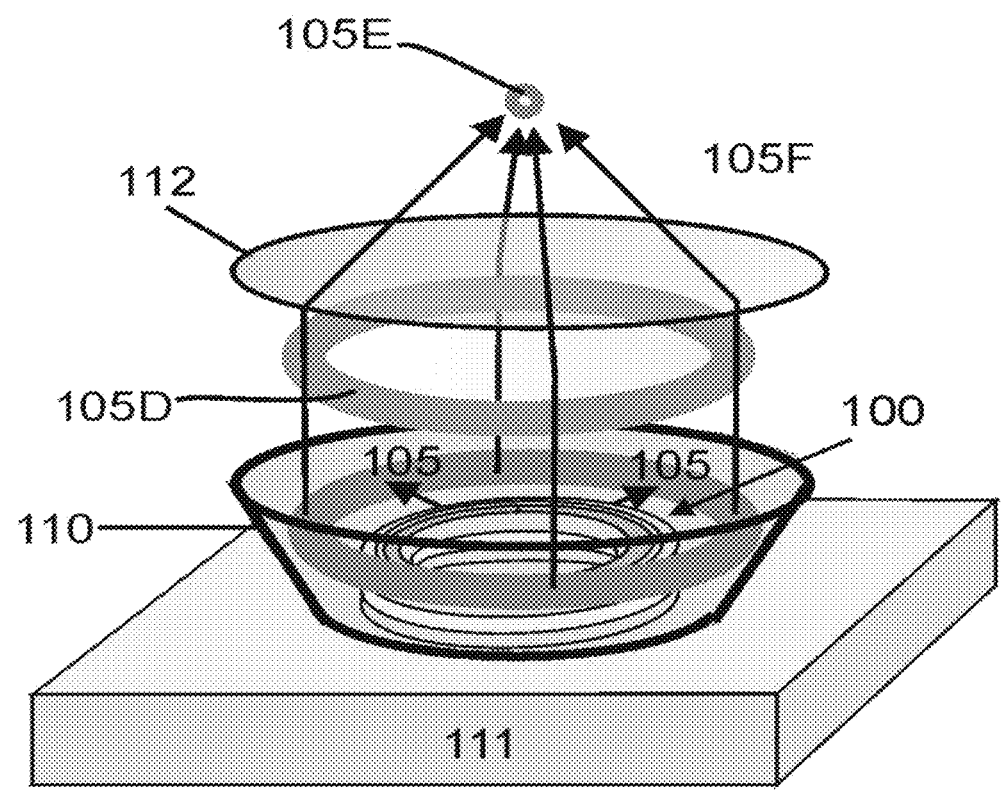
FIG. 2B shows an offset view schematic of a cylindrical ring laser as related to FIG. 2A where the reflected radiation is further concentrated or collimated by an optical lens or optical system in accordance with an embodiment of the present invention.

Referring to FIG. 2B, a cylindrical ring laser 100 is shown positioned on a cold plate in accordance with the invention capable of circumferential radiation 105, with the circumferential radiation being redirected vertically 105D with an angled three dimensional reflective conical mirror 110 and focused or collimated by an optical component 112 to a concentrated spot 105E or collimated beam (not shown) directed away from the surface of the laser.

Figure 3:
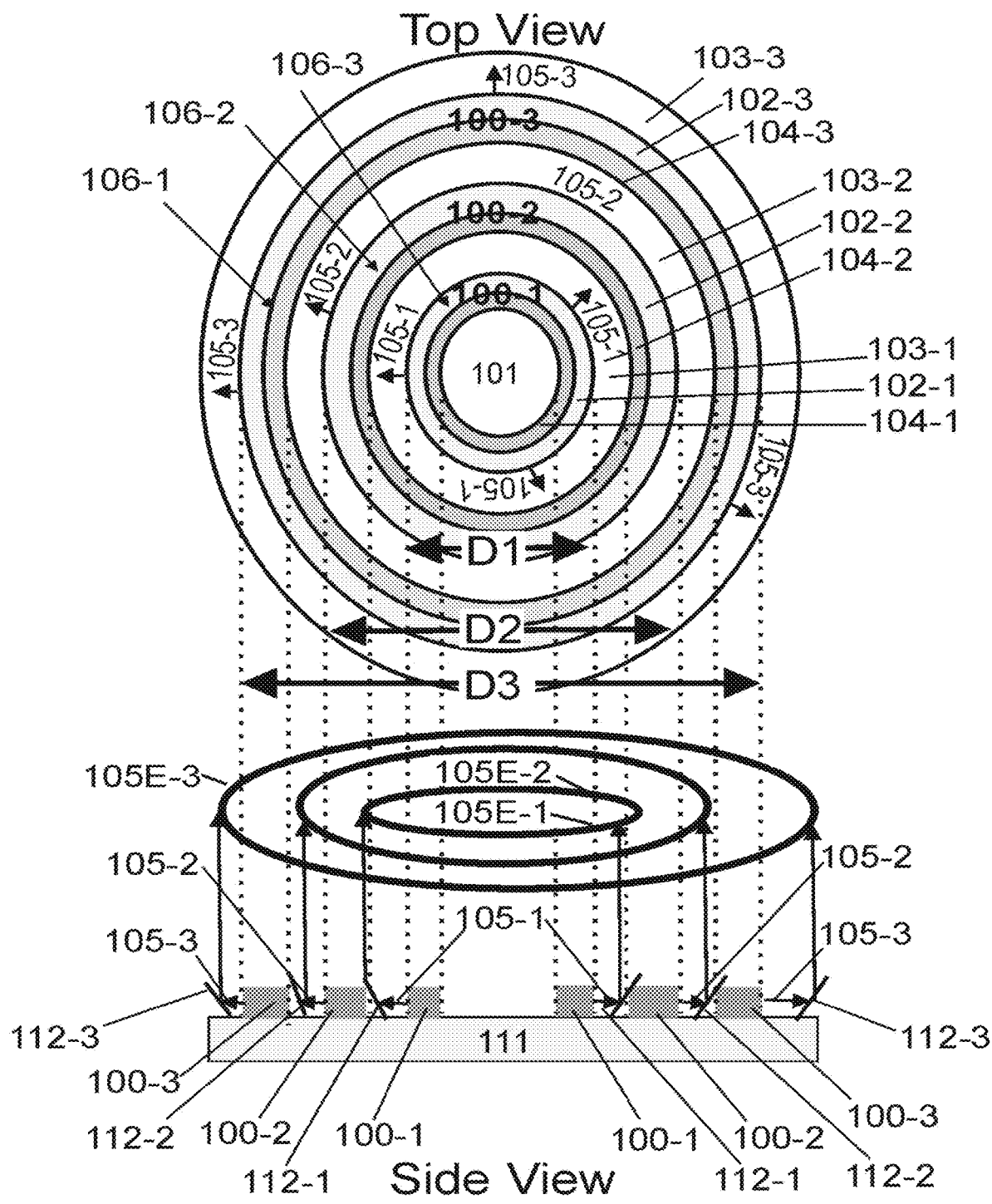
FIG. 3 shows a combined top and side views of a concentric multi-element cylindrical ring laser array, the sideview also includes incorporation of concentric three-dimensional mirrors to redirect the circumferential laser radiation from each element in accordance with an embodiment of the present invention.

Referring to FIG. 3 the top view shows a multi-element concentric cylindrical ring laser with laser elements 100-1, 100-2, 100-3, each laser element containing a cylindrical ring waveguide formed by ring waveguide regions 102-1, 102-2, 102-3 of higher refractive index than that of the neighboring layers (for example laser element 100-1 has waveguide region 102-1, inner region 101 and outer region 103-1, while laser element 100-2 with waveguide region 102-2 has inner region 103-1 and outer region 103-2) with each waveguide region 102 housing an optically active gain media. The cylindrical ring laser elements are configured concentrically about a central region 101, with outer ring diameters D1, D2 and D3 respectively. The laser elements are individually addressed by independent pump sources 106-1, 106-2, 106-3 which overlap with optically active gain media housed within their respective waveguide regions 102 forming gain confining regions 104-1, 104-2, 104-3 thereby supporting independent radial emission from each laser element 105-1, 105-2, 105-3 in accordance with an embodiment of the present invention. The cross-sectional side view shows placement of concentric three-dimensional conical mirrors 112-1, 112-2, 112-3 to redirect laser circumferential laser radiation 105-1, 105-2, 105-3 away from (perpendicular) the laser surface forming independent radiation rings 105E1, 105E-2, 105E-3.

Figure 4A:
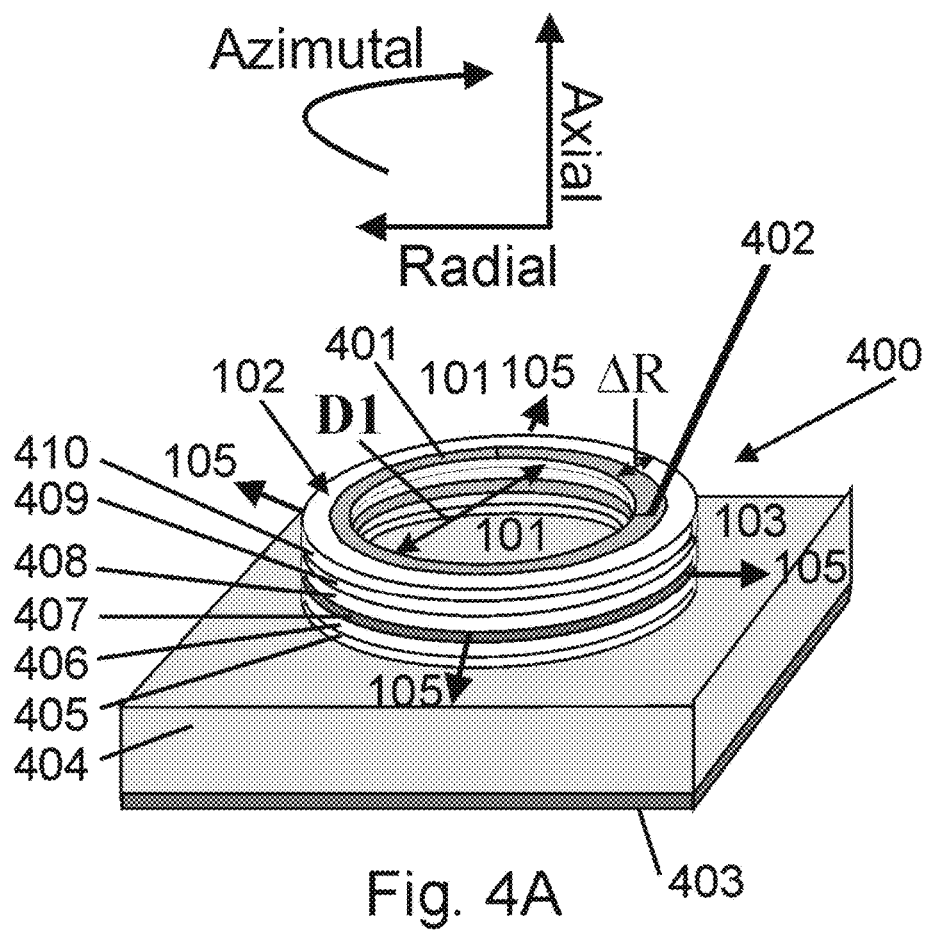
FIG. 4A shows a simplified offset view three-dimensional drawing of a semiconductor ridge wave-guide cylindrical ring laser in accordance with an embodiment of the present invention.

Turning to FIG. 4A there is shown one example of a cylindrical ring semiconductor laser apparatus 400 in accordance with an embodiment of the invention. The apparatus 400 in this example makes use of a semiconductor laser epitaxial media following a diode laser configuration formed by an n-type semiconductor substrate 404, an n-type cladding 405 and n-type waveguide layer 406, an active layer 407 (comprising of a single layer of direct bandgap semiconductor, quantum well region or quantum dot region), a p-type waveguide layer 408, a p-type cladding layer 409 and a p-type contact layer 410. The respective waveguide and cladding layers establish an axial waveguide establishing one or more axial modes overlapping with the active layer 407. A cylindrical ridge waveguide is formed in the semiconductor epi-layers by etching a circular ring of inner diameter D1 and outer diameter D1+$\Delta$R extending into the semiconductor in the axial dimension, which establishes a radial waveguide. The radial waveguide comprising of a cylindrical ring waveguide region 102 of width $\Delta R$, inner region 101 and outer region 103 (in this case formed by the air ambient) with refractive index of region 102 greater than that of regions 101 and 103. Electrical contacts are made to the substrate 404 and top p-type contact layer 410, with anode contact 402 and cathode contact layer 403. Application of a forward voltage between these contacts injects carriers into the active layer 407 producing optical gain within the active layer. The injected current is limited to annular region 401 ether by limiting the contact opening or by limiting the extent of the p-type dopant to an outer radius smaller than the cylindrical ring waveguide outer radius, establishing a gain confining region within the active layer. The gain confining region offsets the modal confinement factors of the radial modal constituency thereby favoring amplification of a preferred set of radial modes supporting efficient radial laser emission 105. The device is cooled by heat extraction through the substrate 404.

Figure 4B:
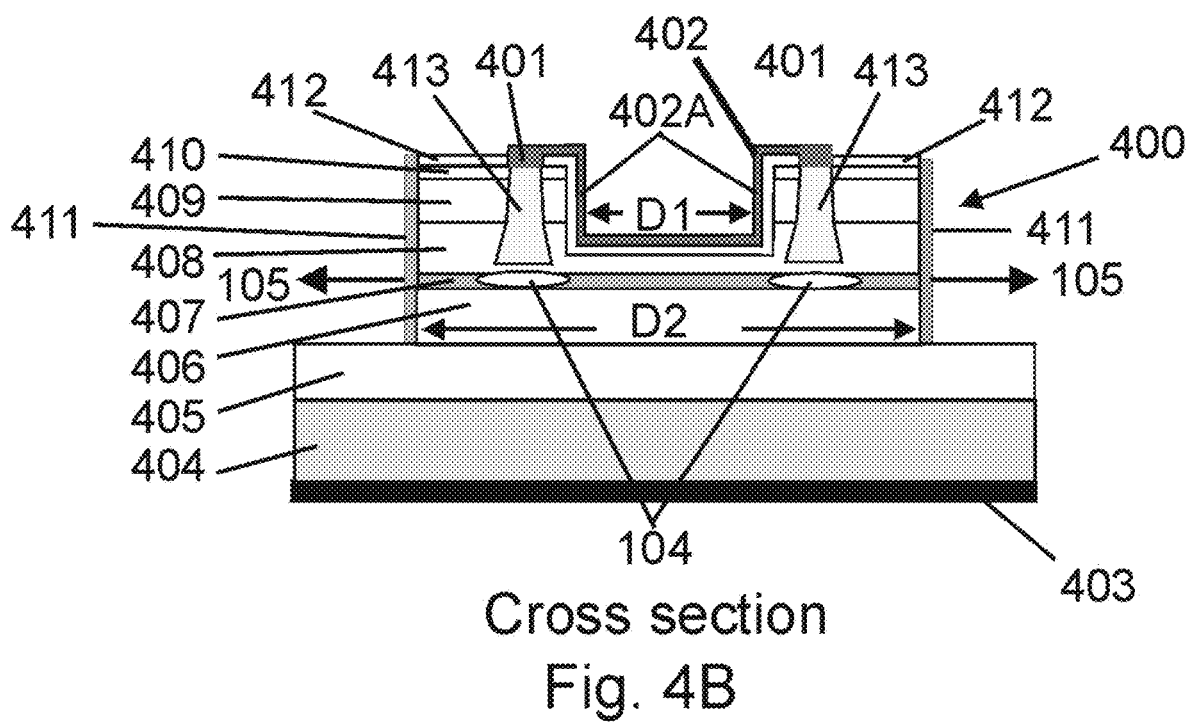
FIG. 4B shows a radial cross-sectional view of a semiconductor ridge waveguide cylindrical ring laser as related to FIG. 4A with selective electrical contacts defining current injection pathways into the active layer in accordance with an embodiment of the present invention.

FIG. 4B illustrates a cross section of the cylindrical ring semiconductor laser device 400 according to an embodiment of the invention. The cylindrical waveguide is of inner diameter D1 and outer diameter D2, with outer surface having an optical coating 411 serving as the output coupler for the circumferentially emitted laser radiation 105. A central contact pad 402A is formed in the center of the ring overlapping the p-type current contact openings 401 within a conformal insulating layer 412 deposited on top of the p-type contact layer 410. Application of a forward bias between the anode electrode 402 and cathode 403 establishes current flow profile 413 (that is the flow of p-type carriers) through the p-type epitaxial layers 408-410 thereby injecting p-type carriers into the active layer confined to regions commensurate with contact openings 401. Selective contact openings 401 serve to define the current profile 413 in both the radial and azimuthal direction. The p-type carriers recombined radiatively with n-type carriers in the active layer forming a gain confining region 104 thereby establishing a gain confining region 104 within the active layer 407. The gain confining region 104 offsets the modal confinement factors to favor amplification of a preferred set of radial modes supporting efficient radial emission 105 in accordance with the present disclosure.

Figure 4C:
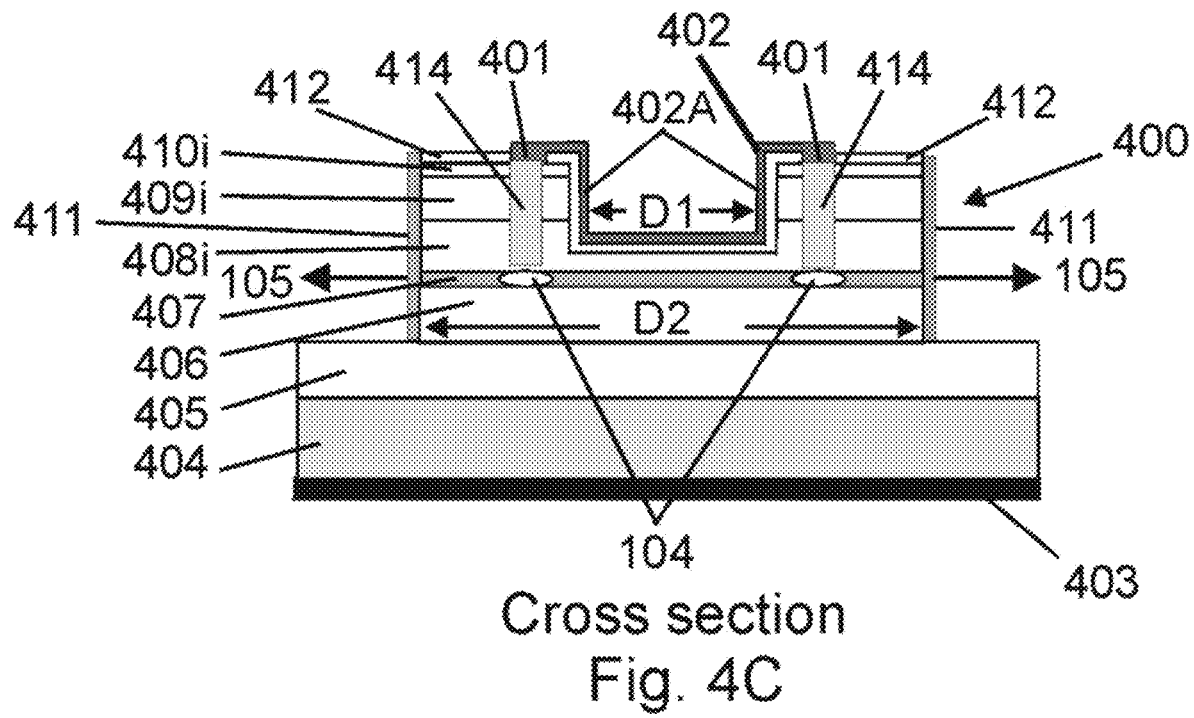
FIG. 4C shows a radial cross-sectional view of a semiconductor ridge waveguide cylindrical ring laser as related to FIG. 4A with selective p-type doped layers to limit current spreading of injected carriers into the active layer in accordance with an embodiment of the present invention.

FIG. 4C shows a cross section a cylindrical ring semiconductor laser device employing selective p-type doped regions 414 to define the radial and azimuthal current profile through the top epitaxial layers according to an embodiment of the invention. The selective p-type dopant defines the current pathway of p-type carriers through intrinsically or lightly n-type doped top epitaxial layers ($408i$-$410i$), electrical contact is made to the selective p-type region by contact openings 401 through a conformal insulating layer 412. Application of a forward bias between anode 402 and cathode 403 causes p-type carriers to flow through the selective p-type regions defining the spatial regions of p-type carrier injection and carrier recombination in the active layer 407 thereby establishing a gain confining region 104. The gain confining region 104 is limited to a radius less than the outer radius of the cylindrical ring waveguide to support amplification of preferred set of radial modes supporting efficient radial emission.

Figure 4D:
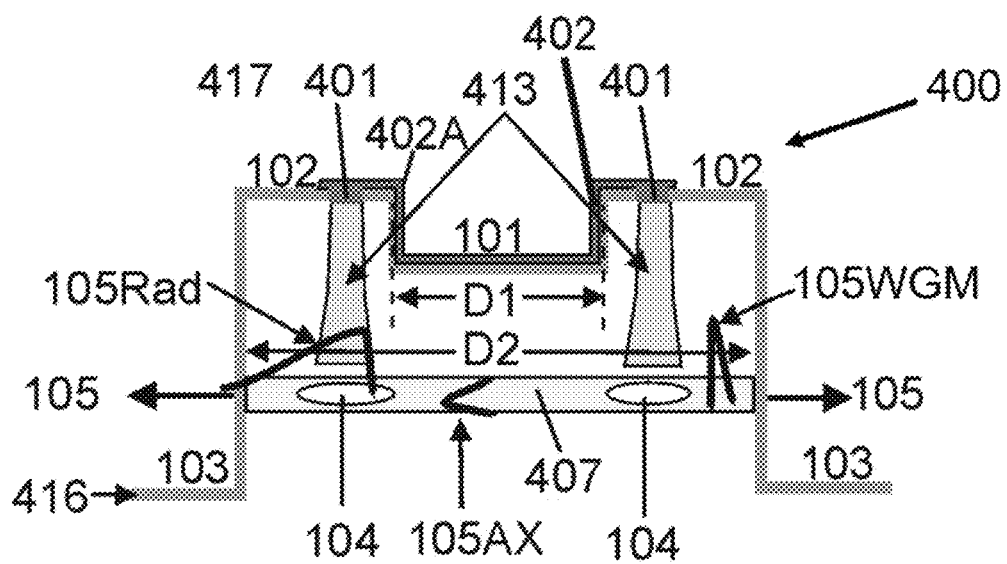
FIG. 4D shows the cross-sectional radial variation of the index of refraction of a semiconductor ridge waveguide cylindrical ring laser as related to FIG. 4A along with modal profiles, current injection profiles and gain confining region within the active layer in accordance with an embodiment of the present invention.

FIG. 4D illustrates a cross-sectional view of the cylindrical ring semiconductor laser device 400 with the radial refractive index profile 415 according to an embodiment of the invention. A cylindrical ridge waveguide is formed by a multi-level radial etch with index of refraction profile inversely proportional to etch depth. The cylindrical ridge waveguide is formed by regions 101, 102, 103 with region 102 of higher refractive index than that of region 101 and 103. The cylindrical ring waveguide has an inner diameter D1 and outer diameter D2 supporting a plurality of radial modes with an associated set of degenerate azimuthal modes and one or more axial modes. The intensity profiles of high Q-factor Whispering Gallery Modes(WGM) 105WGM with intensity profiles located near the outer diameter of the cylindrical ring waveguide D2 which support very low radial emission and lower Q-factor modes which have intensity profiles and radial emitting modes with smaller intermediate Q-factors having intensity profiles 105Rad within the cylindrical ring waveguide are illustrated. The radial modes have an associated set of degenerate azimuthal modes (not shown) and at least one axial mode formed by the epitaxial structure (layers 405-410 FIG. 4C), a single axial mode intensity profile 105AX is illustrated overlapping significantly with active layer 407. The gain confining region 104 within the active layer 407 is established through select contact openings 401 and is shown to overlap more substantially with intensity profiles 105Rad of intermediate Q-factor modes than high Q-factor Whispering Gallery Modes 105WGM thereby favoring amplification of radial modes which support efficient radial emission 105.

Figure 5:
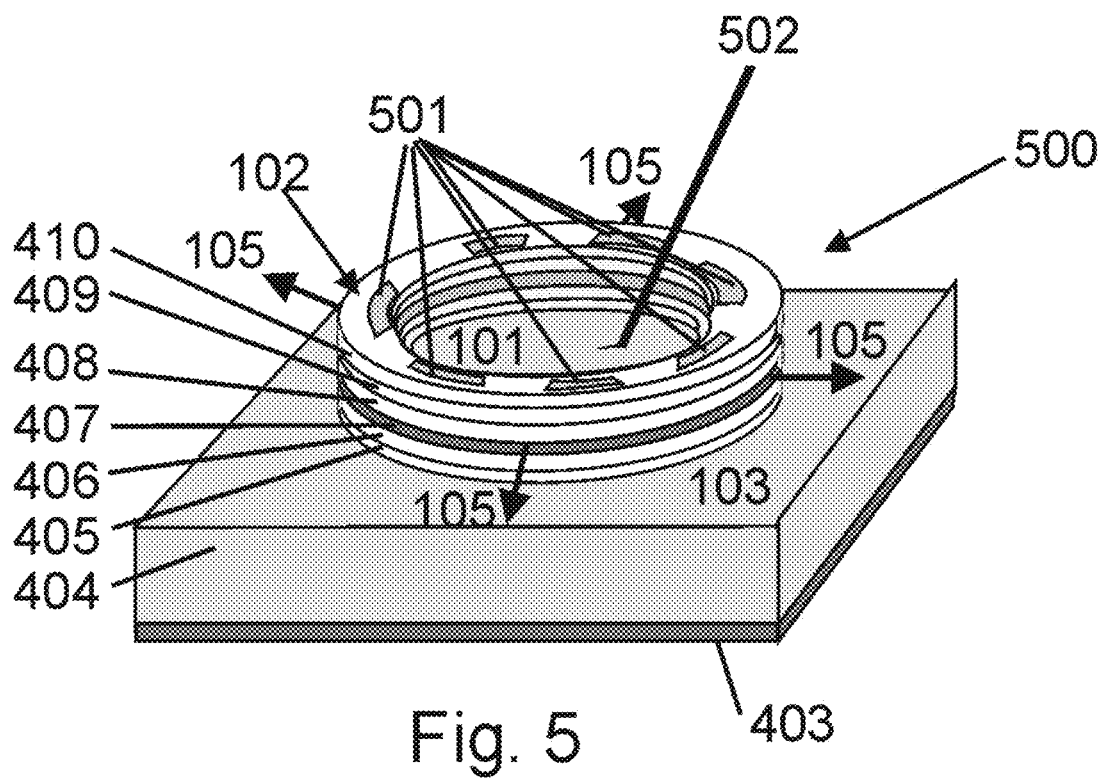
FIG. 5 shows a radial offset view of a semiconductor ridge waveguide cylindrical ring laser resonator employing non-uniform anode contact windows in accordance with an embodiment of the present invention.

Referring to FIG. 5 a cylindrical ring semiconductor laser device 500 of type 400 according to an embodiment of the invention is shown with top segmented contact openings 501 tailored in both the azimuthal and radial dimension. A central contact pad with anode-electrode 502 is formed in the center of the ring overlapping the individual contact openings 501 positioned on top of the cylindrical ring waveguide formed by region 102. Application of a bias potential between the top electrode 502 and bottom cathode electrode 403 results in a forward current flow limited to regions under the segmented contact openings 501, injecting electrons and holes into the active layer restricted to regions defined by segmented contact openings 501 forming gain confining regions within the active layer 407. The segmented gain confining regions within the active layer are limited in both the radial and azimuthal dimension according to the segmented contact openings 501. Limiting the gain confining region in the radial and azimuthal dimension allows for amplification of selected azimuthal and radial mode sets with intensity profiles which substantially overlap with the gain regions thereby amplifying radial modes supporting efficient radial emission 105 with a subset of radial and azimuthal modes.

Figure 6A:
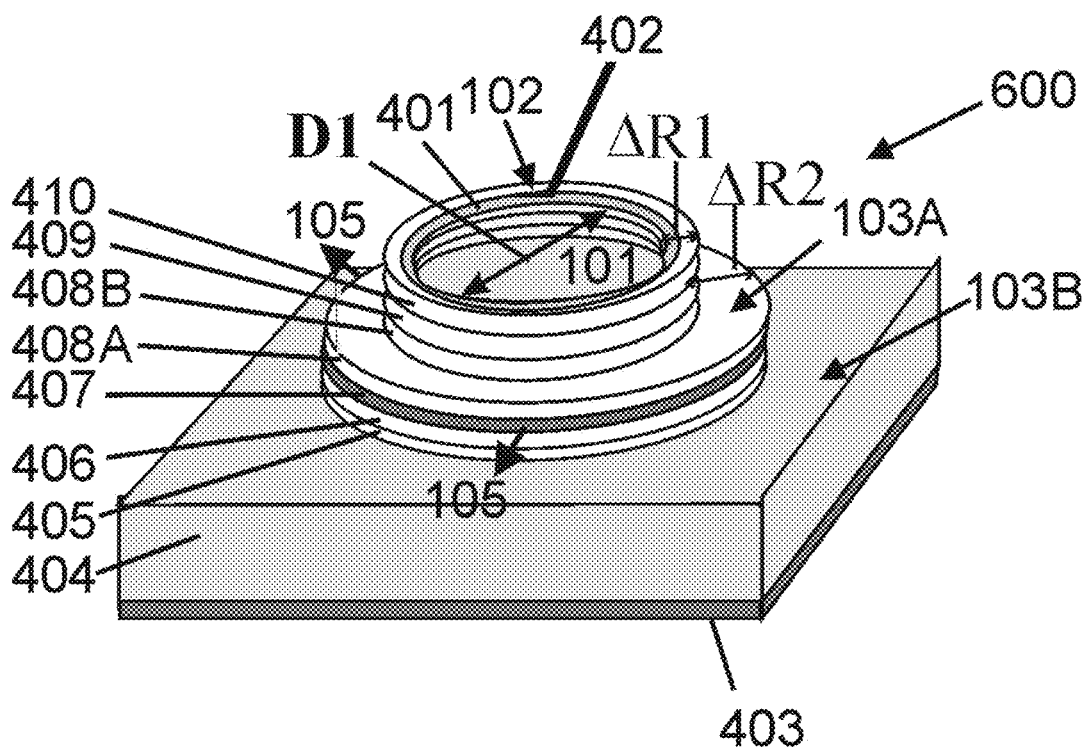
FIG. 6A shows a simplified offset view three-dimensional drawing of a multi-step ridge waveguide semiconductor cylindrical ring laser in accordance with an embodiment of the present invention.

FIG. 6A shows a schematic of a cylindrical ring semiconductor laser device 600 of type 400 featuring a multi-step cylindrical ridge waveguide defined by three regions 101, 102 and 103a, an outer region 103B is etched down to a layer deeper than the active layer 407 allowing the radiation 105 to exit the laser resonator according to an embodiment of the invention. Based on conventional ridge-waveguide theory, an effective index step is established with respect to the unetched region 102 of index n2 for regions 101 and 103A with the magnitude inversely proportional to the distance of the etched surface to the active layer. This methodology allows the index step defining the cylindrical ridge-waveguide to be defined by an etch profile and not by changes to materials. Region 101 is defined by a first circular etch of diameter D1 establishing an effective index n1 such that n2>n1, region 103A has an annular of width ΔR2 of inner diameter D2=D1+ΔR1 and outer diameter D3=D1+ΔR1+ΔR2, the depth or region 103A is to a level in the p-type epitaxial layers above the active layer 407, in this example the depth is within layer 408 splitting the layer into two segments 408A and 408B establishing an effective index n3A with n2>n3A. A third annular etch of inner diameter D3 etch forms an outer region 103B external to the waveguide exposing the active layer thereby forming the output coupler of the device allowing the radial emission 105 to exit the cylindrical ring laser resonator circumferentially. Application of a forward bias between electrodes 402 and 403 establishes a diode current that injects carriers into the active layer 407 through contact openings 401 forming gain confining regions within the active layer 407 thereby amplifying a preferred set of modes supporting efficient radial laser emission.

Figure 6B:
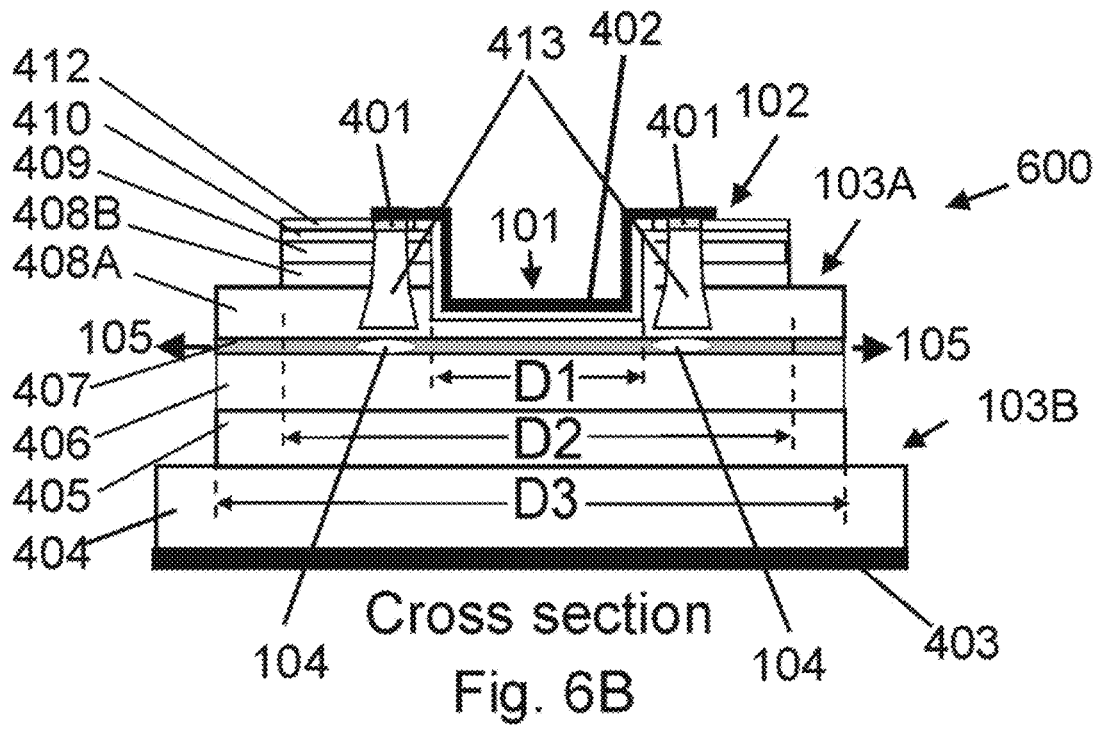
FIG. 6B shows a cross sectional view of a multi-step ridge waveguide semiconductor cylindrical ring laser as related to FIG. 6A in accordance with an embodiment of the present invention.

FIG. 6B shows a radial cross-sectional view of a cylindrical ring semiconductor laser device 600 with a multi-step cylindrical-ridge waveguide of FIG. 6A according to an embodiment of the invention. The semiconductor cylindrical ridge-waveguide laser 600 is defined by 3 etches of diameters D1, D2 and D3 exposing layers of the p-type epitaxy establishing an effective index profile thereby establishing a cylindrical ring ridge-waveguide structure between regions 101, 102 and 103A. An external region 103B of inner diameter D3 exposes the active layer allowing circumferential laser radiation to exit the laser resonator. Application of a forward bias between electrodes 402 and 403 causes current to flow through contact openings 401 in dielectric layer producing an axial current profile 413 spatially limiting the injection of p-type carriers into the active layer 407 thereby establishing gain confining regions 104 within the active layer 407. The gain confining region is restricted to radii smaller than the outer diameter of the cylindrical ring waveguide thereby amplifying a preferred set of mode supporting efficient radial emission.

Figure 6C:
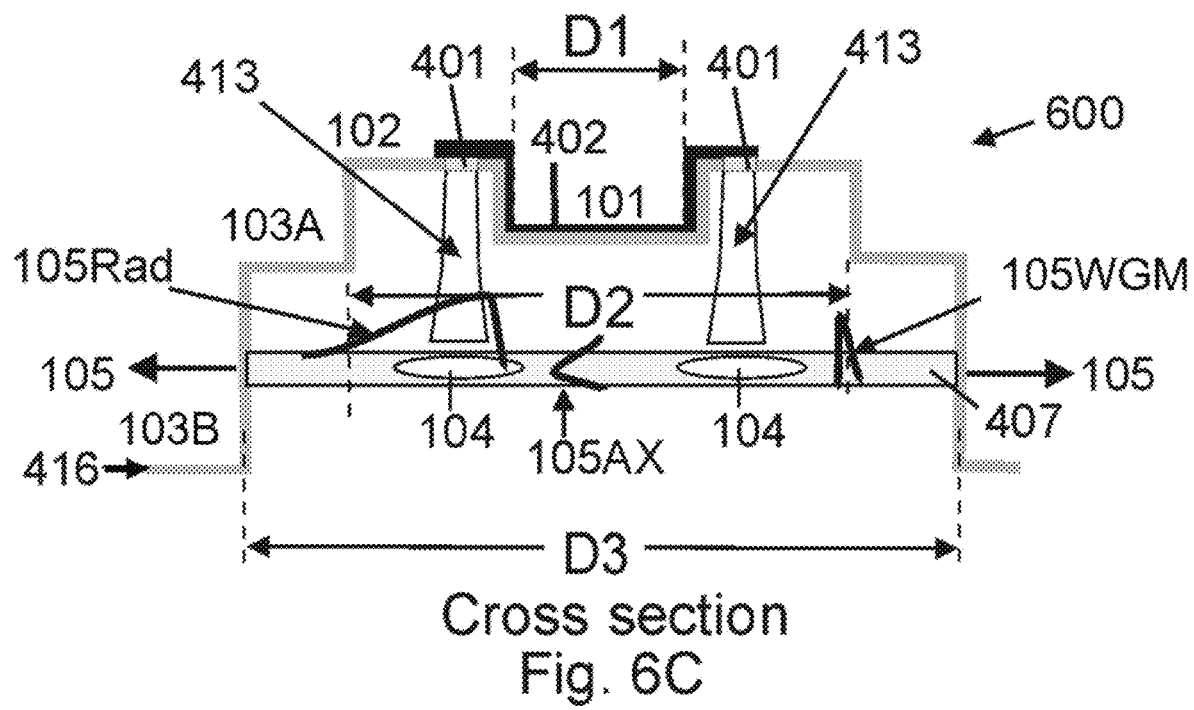
FIG. 6C shows a cross-sectional radial profile of the refractive index of a multi-step ridge waveguide cylindrical ring semiconductor laser in accordance as related to FIG. 6A with an embodiment of the present invention.

FIG. 6C, illustrates the refractive index profile of the laser device 600 formed with a multi-step cylindrical ridge-waveguide according to an embodiment of the invention. The cylindrical ring waveguide is defined by annular regions of different etch depth into the semiconductor epitaxy, with region 101 a circular region of diameter D1 producing an effective index n1, an unetched annular waveguide region (highest index region) of 102 with index n2 extending from D1 to D2, and region 103A of effective index n3A extending from D2 to D3 and an external region 103B of index n3B extending from D3 outward, an effective index profile 416 is established for these surfaces inversely proportional to the distance from the exposed p-type epitaxial layer to the active layer 407. The cylindrical ring waveguide is established by regions 101, 102 and 103A with n2>n1 and n2>n3A. The radial intensity profiles of both high Q-factor Whispering Gallery Modes 105WGM and the intensity profile of lower Q-factor radial emitting modes 105Rad supported by the cylindrical ring waveguide are illustrated along with the axial mode intensity profile 105AX established by the epitaxial layers. The current injection profile 413 is produced by application of a forward bias between electrodes 402 and 403 limiting current injection to regions defined by contact openings 401, which shapes the current profile 413 and gain confining region 104 within the active layer 407. The overlap of the gain confining region 414 with the radial and axial mode intensity profiles defines the confinement factor and corresponding threshold level of the various modes, thereby offsetting modal confinement factors to favor a preferred set of radial modes 105Rad supporting efficient radial emission 105.

Figure 7:
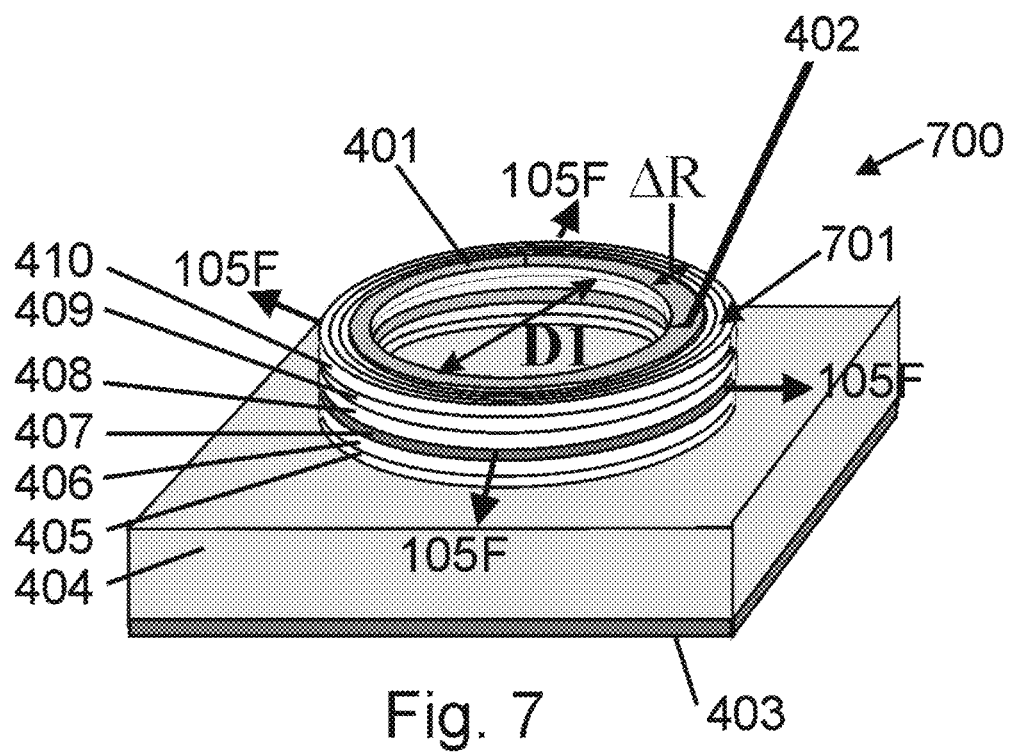
FIG. 7 shows a simplified offset view three-dimensional drawing of a semiconductor ridge wave-guide cylindrical ring laser including distributed Bragg reflector (DBR) positioned to act upon the radial components of the supported modal constituency in accordance with an embodiment of the present invention.

Turning to FIG. 7 there is illustrated an offset view schematic of a cylindrical ring semiconductor laser 700 of type 400 including a distributed Bragg reflector (DBR) 701 positioned in the radial dimension. The DBR structure 701 consists of a periodic array of high and low index steps formed by periodic circular-ridge etch groves with effective index of refraction inversely proportional to distance remaining to the active layer 407, with period corresponding to a Bragg wavelength positioned perpendicular to the radial direction. The DBR structure 701 features gratings extending in the azimuthal extent periodic to the radial dimension, extending to radii less than or equal to the annular extent of the waveguide. The radial period of the structure and refractive index step determining the Bragg wavelength and reflection coefficient of the resultant wavelength dependent mirror. A sub-set of traveling wave modes circulating around the cylindrical waveguide are selected for lasing upon application of a forward bias between electrodes 402 and 403 forming a gain confining region 401 within the active layer 407 thereby amplifying a set of preferred radial modes which are further filtered by the DBR mirror resulting in efficient wavelength dependent radial laser emission 105-F in accordance with this disclosure.

Figure 8:
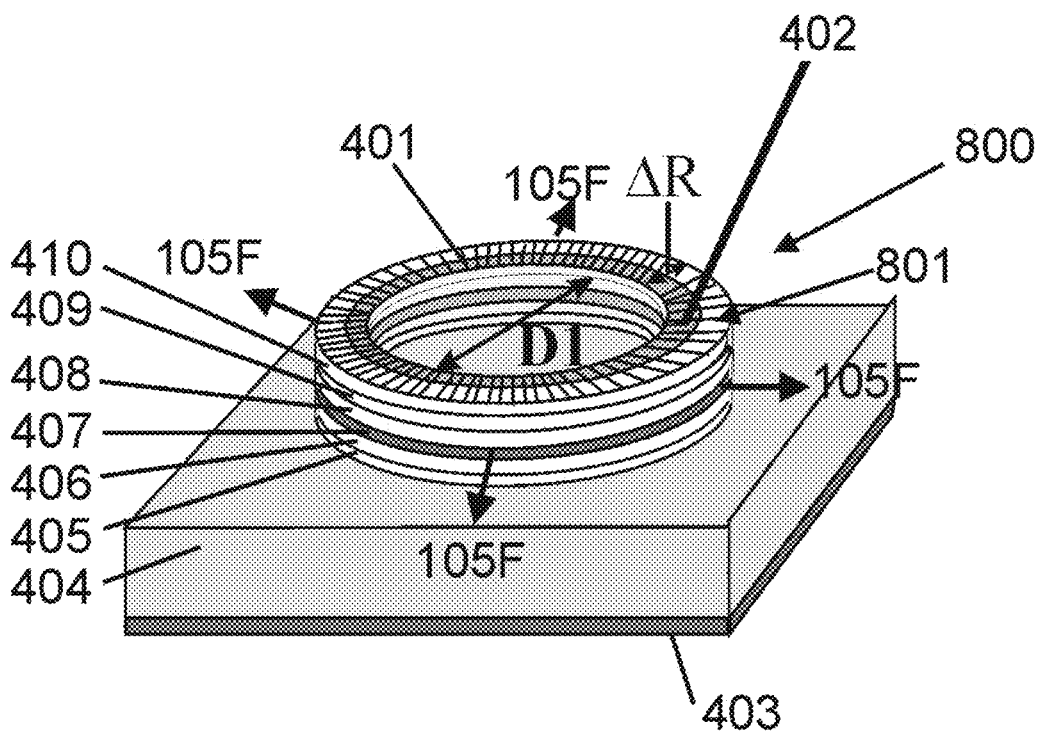
FIG. 8 shows a simplified offset view three-dimensional drawing of a semiconductor ridge wave-guide cylindrical ring laser including a distributed Bragg reflector (DBR) positioned to act upon the azimuthal components of the supported modal constituency in accordance with an embodiment of the present invention.

FIG. 8 shows an offset view schematic of a cylindrical ring semiconductor laser device 800 of type 400 which includes a distributed Bragg reflector (DBR) 801 positioned in the azimuthal dimension according to an embodiment of the invention. The DBR structure 801 consists of a periodic array of high and low index steps formed by periodic circular-ridge etch groves with effective index of refraction inversely proportional to distance remaining to the active layer 407, with period corresponding to a Bragg wavelength positioned perpendicular to the azimuthal direction. The radial extent of the gratings 801 may cover a fraction of or the entire annular extent (from D1 to D1+ΔR) of the cylindrical ring waveguide. The azimuthal period and effective refractive index step defined by the corresponding etch depth of the periodic structure determine Bragg wavelength and reflective properties of the wavelength selective mirror. In this case the azimuthal components of the supported traveling waves circulating around the cylindrical waveguide are filtered by the DBR structure to filter the wavelength of output radiation. A subset of traveling waves circulating around the cylindrical waveguide are selected for lasing upon application of a forward bias between electrodes 402 and 403 forming a gain confining region 401 within the active layer 407 thereby amplifying a set of preferred radial modes with associated degenerate azimuthal modes which are further filtered by the DBR mirror resulting in efficient wavelength dependent radial laser emission 105-F.

Figure 9A:
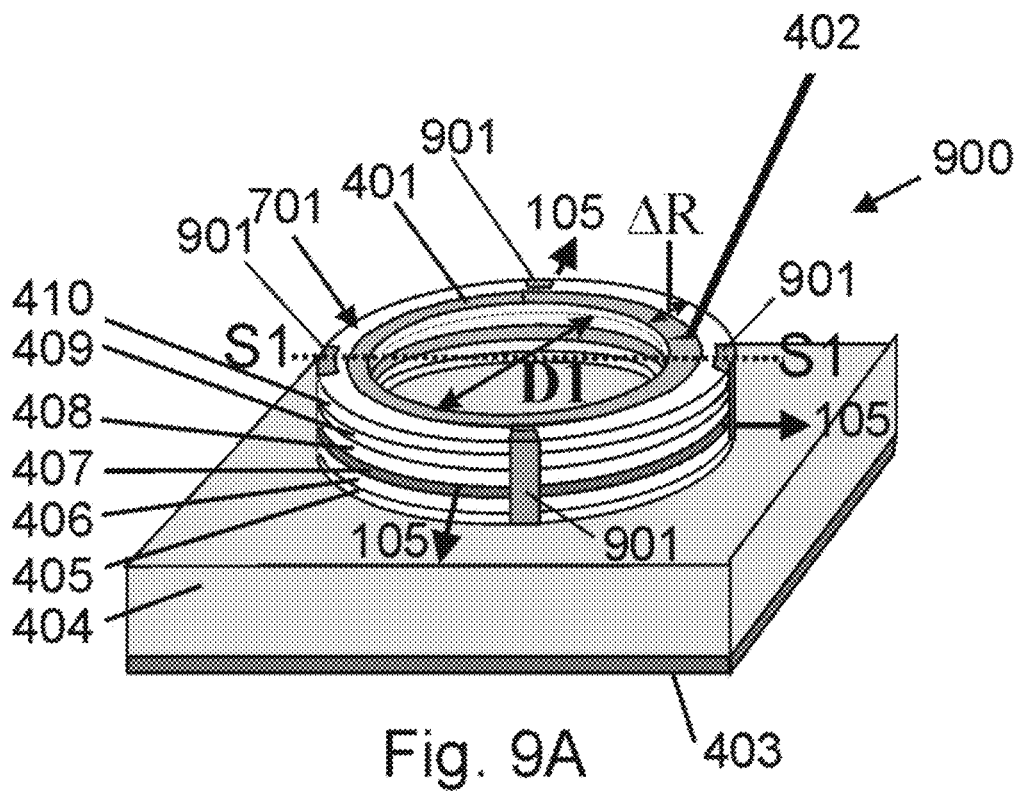
FIG. 9A shows a simplified offset view three-dimensional drawing of a semiconductor ridge wave-guide cylindrical ring laser including distributed attenuation lines in accordance with an embodiment of the present invention.

FIG. 9A shows an offset view of a cylindrical ring semiconductor laser device 900 of type 400 including attenuation lines 901 comprising of high optical loss regions positioned around the circumference of the cylindrical waveguide of limited radial (extending from the outer diameter of the cylindrical ring waveguide (D1+ΔR) inward to radii>D1) and axial extent (extending through the active layer 407 in this example), thereby creating regions of optical loss (absorption) for offsetting modal gains of traveling wave modes with significant intensity at radii commensurate with the radial extent of the attenuation lines according to an embodiment of the invention. The attenuation lines 901 establish a gain confining region limited to radii less than the radial extent of the attenuation lines. Application of a forward bias between electrodes 402 and 403 injects carriers into the active layer favoring modal amplification of traveling wave modes which overlap more substantially with the gain confining region thereby amplifying a set of preferred radial modes supporting efficient radial laser emission 105.

Figure 9B:
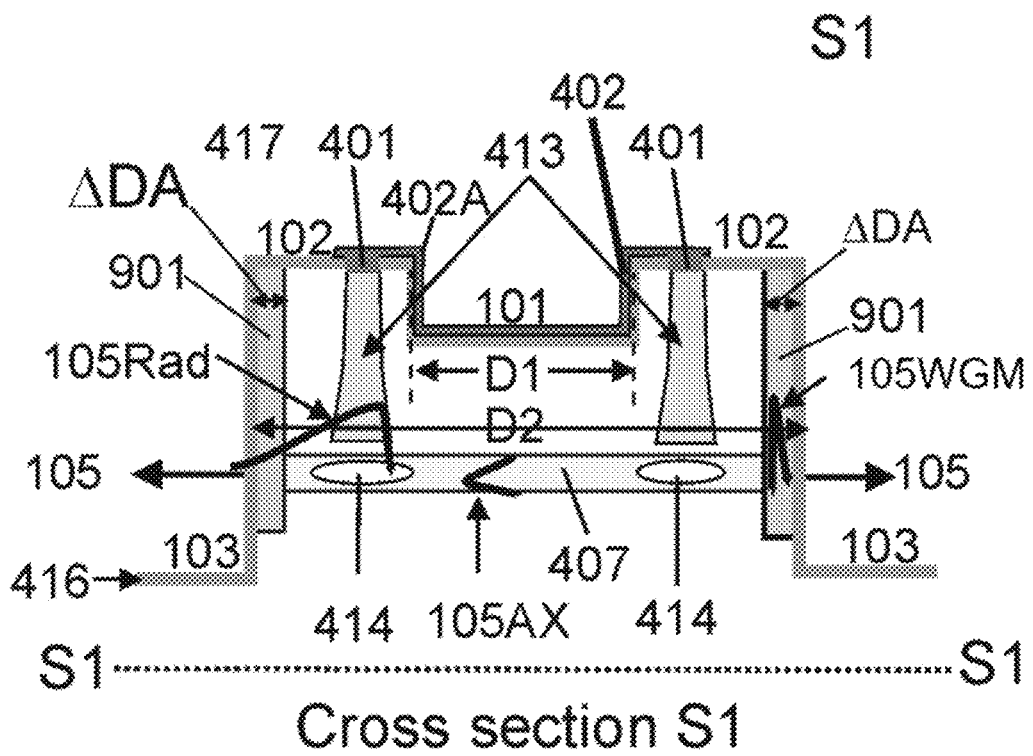
FIG. 9B shows the cross-sectional refractive index profile of a semiconductor ridge wave-guide cylindrical ring laser resonator as related to FIG. 9A with attenuation lines in accordance with an embodiment of the present invention.

FIG. 9B shows a cross sectional view of an effective refractive index profile 415 of device 900 at cross section S1 intersecting a pair of attenuation lines 901 of annular width AD according to an embodiment of the invention. Circulating traveling wave modes with radial (105Rad, 105WGM) and axial mode 105AX intensity profiles are supported by the cylindrical ring waveguide. Traveling wave modes with intensity peaks incident upon the attenuation lines experience significant optical loss. The round-trip loss of attenuated modes is determined by the number of attenuation lines and overlap of the attenuation lines with the modal intensity profile. By limiting the radial extent of the attenuation lines 901 to outer diameters (regions defined by ΔDA where the WGMs 105-WGM have high intensity) radial modes 105-RAD with intensity peaks at lower radii are less affected by the attenuation lines and experience less loss and are therefore favored over 105-WGMs which have intensity peaks near the outer diameter of the cylindrical ring waveguide as illustrated. The attenuation lines 901 can be used in conjunction with gain confining region 104 defined by the carrier injection profile 413 or as the sole mechanism for offsetting the modal confinement factors of radial modes to select a subset of modes supporting efficient radial emission 105.

Figure 10A:
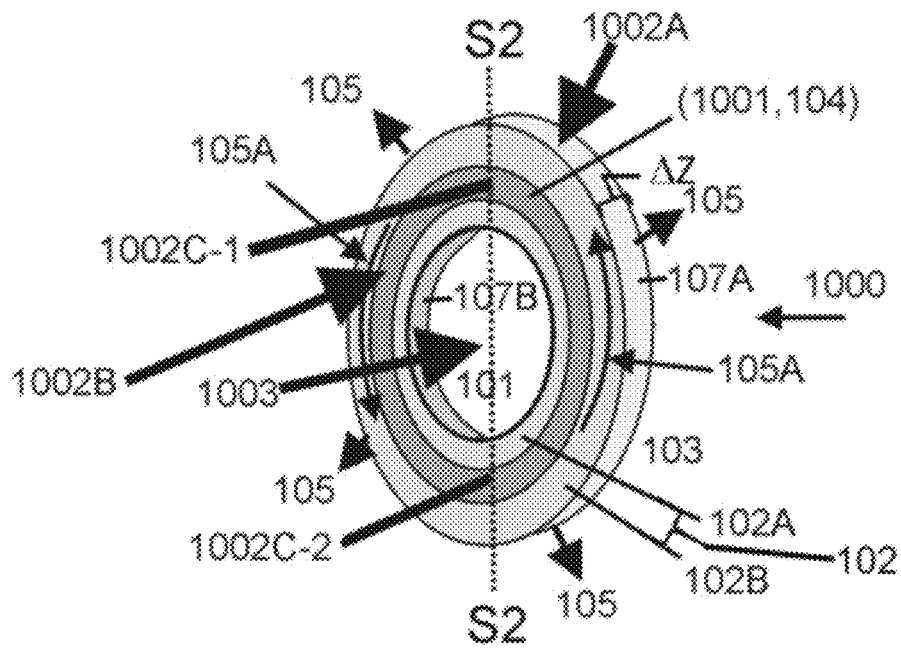
FIG. 10A shows a schematic of a solid-state cylindrical ring laser with multiple pump configurations in accordance with an embodiment of the present invention.

FIG. 10A shows a cylindrical ring solid-state laser device 1000 formed by a multi-concentric layered cylindrical ring solid-state disk or tube in accordance with and embodiment of the invention. The solid-state matrix used to make the cylindrical resonator 1000 contains a homogeneous a multi-layered gain loaded matrix 1001 consisting of distinct layers of radially varying rare earth dopant concentrations and refractive indices to produce optical amplification when pumped by an external optical source 1002 (1002A, 1002B, 1002C). The solid-state cylindrical disk is comprised of multiple concentric layers of differing refractive index of finite thickness in the axial dimension forming annular regions 101, 102 (including 102A, 104 and 102B), and 103. The layers are designed to form a cylindrical ring resonator with the refractive index of region 102 higher than the inner region 101 and outer region 103, thus forming a cylindrical ring optical waveguide thereby providing both radial and axial optical confinement supporting at least one axial mode and a plurality of radial modes with degenerate azimuthal modes.

The cylindrical waveguide may include an outer optical coating 107A and an inner optical coating 107B to optimize laser emission. The cylindrical ring waveguide region 102 includes a gain media 1001 containing at least one rare earth dopant). The rare earth dopants may include, but are not limited to, one or more selected from the group of: Erbium (Er), Ytterbium (Yb), Neodymium (Nd); Thulium (Tm); Praseodymium (Pr); Cerium (Ce); Holmium (Ho); Yttrium (Y); Samarium (Sm); Europium (Eu); Gadolinium (Gd); Terbium (Tb); Dysprosium (Dy); and, Lutetium (Lu). Transition metals such as Chromium (Cr) and Titanium (Ti) may also be incorporated. An optical pump radiation source 1002 consists of one or more independent optical sources with operational wavelengths which are absorbed by the Rare Earth doped gain media which re-admit photons at a higher wavelength thereby creating optical amplification. Optical pump illumination may be supplied by ether free-space radiation 1002A, 1002B or waveguide coupled radiation directed at the gain media ether by side illumination 1002A, perpendicular illumination 1002B or by multiple independent fiber-coupled laser sources 1002C. Efficient free-space pumping schemes would require multiple free space pump beams which may be redirected back onto the gain regions with a series of mirrors (not shown). The overlap of the optical pump illumination and the gain media 1001 produces a gain confining region 104 (which overlaps the gain media 1001 in this example). The axial modal constituency can be tailored by the physical extent $\Delta Z$ of the solid-state media, utilization of an axially varying multi-layered media, or by limiting the gain confining region in the axial dimension. The gain confining region is restricted to radii less than that of the cylindrical ring waveguide outer radius to offset modal confinement factors to favor radiation of a preferred set of modes supporting efficient radial emission 105. Laser radiation is achieved by increasing the pump source intensity sufficiently to increase the preferred modal set's modal gain over that of associated round-trip losses establishing circumferential laser emission. The cylindrical resonator 1000 is configured with a hollow center allowing access for a liquid coolant 1003 to flow through the device for heat removal.

Figure 10B:
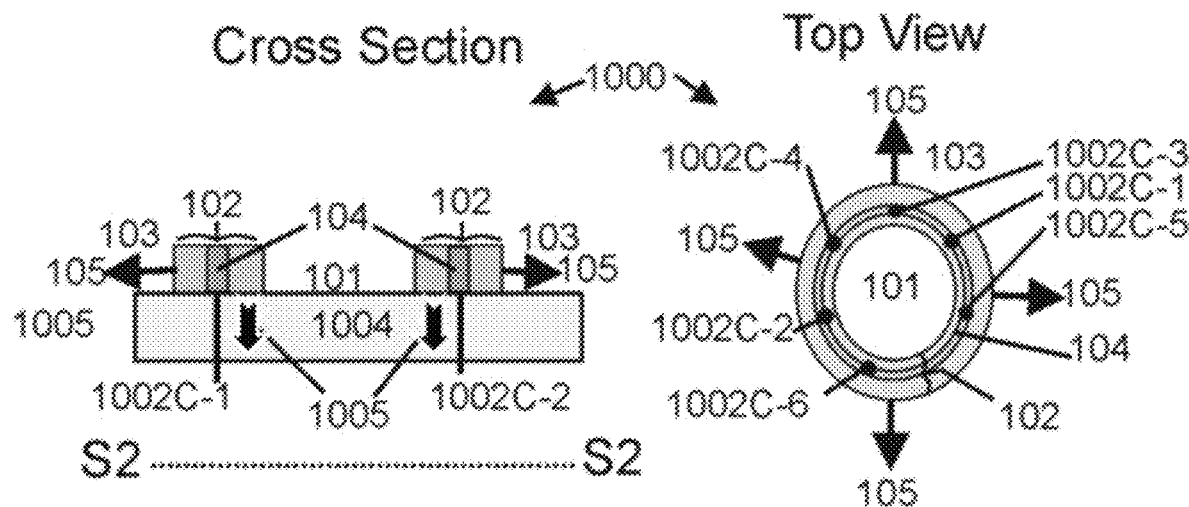
FIG. 10B shows cross-sectional and top views of a solid-state cylindrical ring laser mounted as related to FIG. 10B on a heat conducting substrate for active cooling. A top view schematic illustrates an optical pump strategy employing multiple independent fiber coupled light sources to establish a gain confining region in accordance with an embodiment of the present invention.

FIG. 10B shows a cross sectional view along line segment S2 and top view of the cylindrical ring solid-state laser device 1000 according to an embodiment of the invention. Referring to the cross-sectional view, the cylindrical ring waveguide is formed by regions 101, 102 and 103 with the refractive index of region 102 greater than that of regions 101 and 103, region 102 housing a gain media illuminated by independent fiber optic pump sources 1002C1 and 1002C2, the overlap of which defines the gain confining region 104. The solid-state laser device is positioned on a heat removing substrate 1004 which draw heat 1005 from the cylindrical ring laser resonator. The top view of cylindrical ring solid-state laser 1000 shows a number of independent optical fiber pump sources 1000C1-1000C6 positioned around the waveguide at various azimuthal angles and radius illuminating region 102, the overlap of the absorbed pump radiation and material gain media (overlapping region 104 in this case) establishes the gain confining regions 104. Upon sufficient pump radiation intensity, the laser supports efficient radial emission 105.

Figure 11A:
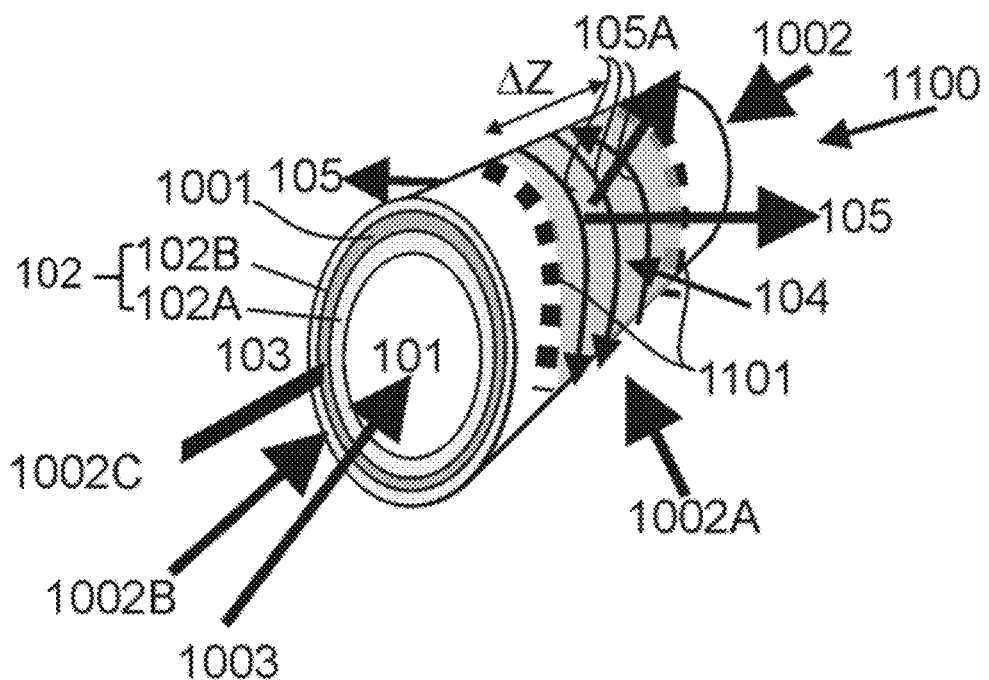
FIG. 11A shows an offset view schematic of a multi-layered solid-state cylindrical ring laser with axial attenuation lines in accordance with an embodiment of the present invention.

FIG. 11A shows cylindrical ring solid state laser 1100, including a multi-layer solid state cylinder ring resonator consisting of multiple concentric layers forming cylindrical waveguide regions 101, 102 and 103 in the geometric shape of a cylindrical tube with attenuation lines 1101 to limit extent of axial modes. The multi-cylindrical layers support a refractive index profile with the refractive index of region 102 greater than that of regions 101 and 103, with region 102 including at least one rare earth dopant layer 1001 positioned between regions 102A and 102B with the same or higher refractive index to region 102. Optical amplification is achieved by optical pumping (1002) the gain media, with the overlap of the gain media and pump radiation forming the gain confining region 104 confined to the regions between the two attenuation lines $\Delta Z$. Region 101 is hollow allowing a liquid coolant 1003 to flow through the center to provide cooling (alternatively the center region may be a solid dielectric). Traveling wave modes 105A are setup in the cylindrical ring resonator traveling in both the clockwise and counterclockwise directions. The pump radiation is provided by ether one or more independent optical sources 1002 consisting of independent lasers coupled to optical fibers 1002C or free space illuminators 1002A, 1002B which overlap with the gain region to form the gain confining region 104. The gain confining region 104 is designed to preferentially overlap with the intensity profiles of radial modes with intermediate Q values supporting efficient radial emission. The axial modal profile is limited by the axial extent of the gain confining region limited in the axial dimension by attenuation lines 1101 to provide axial confinement limiting the number of axial modes to at least one. The laser emits efficient radial emission 105 upon sufficient optical pump radiation.

Figure 11B:
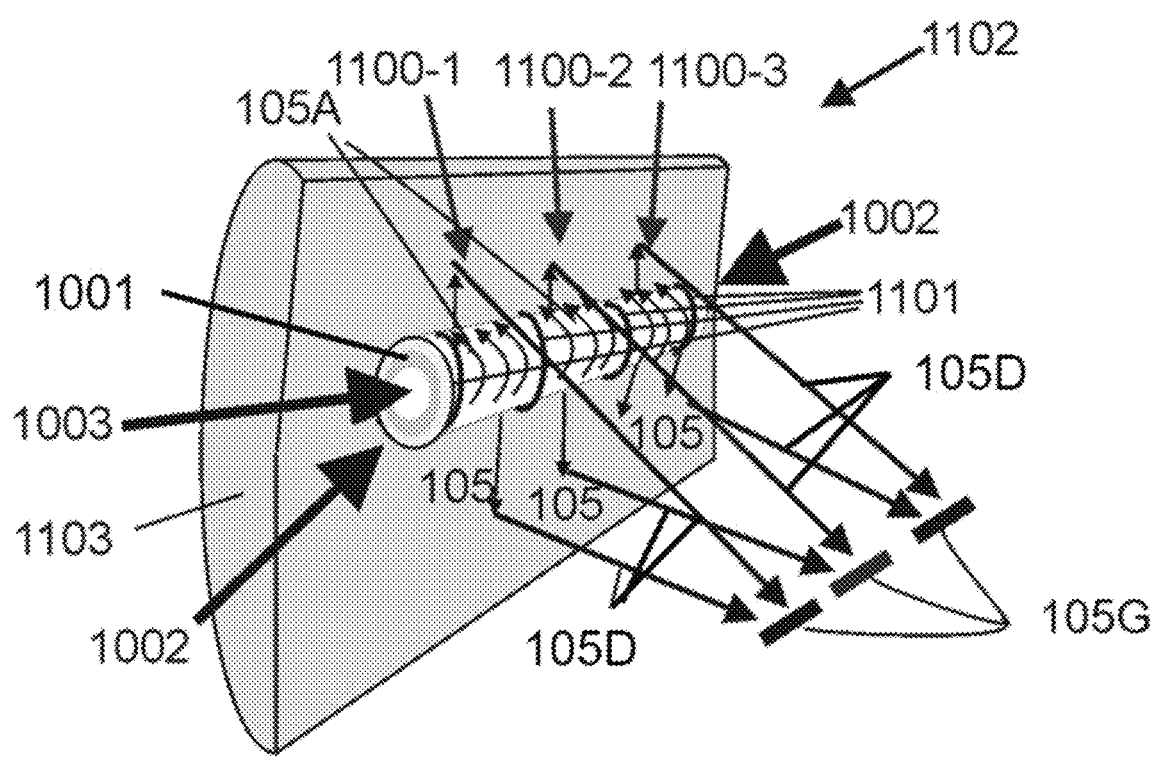
FIG. 11B shows a schematic of a multi-layered solid-state cylindrical ring laser as related to FIG. 11A featuring multiple laser elements stacked in the axial dimension, including attenuation lines, with circumferential radial emission reflected by a three-dimensional reflector to form a concentrated line of laser radiation in accordance with an embodiment of the present invention.

FIG. 11B shows a multi-element cylindrical ring solid state laser 1102 consisting of multiple solid-state cylindrical ring lasers 1100 stacked along the axial direction with a common core according to an embodiment of the invention. The individual elements are denoted as 1100-1, 1100-2 and 1100-3, each of which are capable of independent laser operation when optically pumped 1002 with independent sources. The individual cylindrical ring laser elements are axially separated by attenuation lines 1101 running around the circumference of the cylindrical structure extending in the axial direction to tailor the axial modal constituency of each individual element. The gain confining region 104 is defined by the overlap of optical pump radiation 1002 with the gain media 1001 which is limited to regions between the attenuation lines 1101 or alternatively by the axial extent of the optical pump radiation. Optical Pump radiation is provided by one or more independent optical sources 1002 consisting of one or more independent fiber coupled or free space optical sources. Optical pumping can be achieved in all directions, front, back and side to optimize pump absorption in the tailored gain confining region. The central region may be hollow enabling liquid coolant 1003 to flow through structure for heat removal or solid. The individual laser elements are configured to produce independent efficient radial emission in accordance with this disclosure. The radial emission 105 of the laser elements 1100-1, 1100-2, 1100-3, are reflected by a three-dimensional mirror 1103 for redirecting the radial emission 105D and concentrating the circumferential laser emission to concentrated line segments 105G, or alternatively collimating the laser emission with a parabolic mirror (not shown).

Figure 12A:
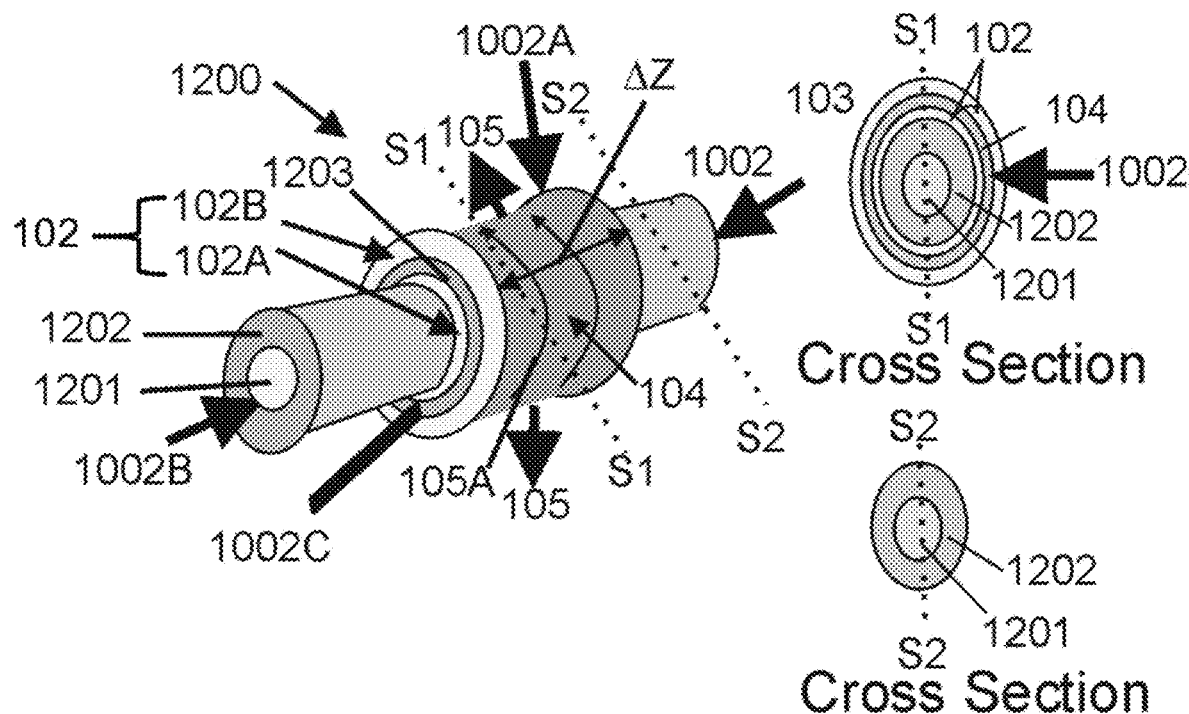
FIG. 12A shows three-dimensional offset and cross-sectional views of a multi-layer solid-state cylindrical ring laser with non-uniform axial structure in accordance with an embodiment of the present invention.

FIG. 12A shows a cylindrical ring solid-state laser device 1200 formed by multi-concentric dielectric cylindrical layers positioned about a central multi-layered core region consisting of a inner core region 1201 and outer core region 1202 "see cross section S2" with the inner core region 1201 possessing a refractive index higher than that of the outer core region 1202 forming a central light guiding region according to an embodiment of the invention. A cylindrical ring resonator is formed about the cylindrical core consisting of discontinuous multiple cylindrical layers of axial extent ΔZ forming waveguide regions 102A and 102B housing a gain layer 1203 including a rare earth dopant. The axial extent of the waveguide ΔZ is tailored to support one or more axial modes. A cross section S1 illustrates the cylindrical layers making up cylindrical ring waveguide regions 102 which house an optical gain media forming a corresponding gain confining region 104 under pump illumination 1002, Optical pump radiation 1002 is provided by one or more independent optical sources ether free space 1002A, 1002B (coupled to the light guiding core) or fiber coupled 1002C sources directed to overlap with the gain layer 1203 to form a gain confining region 104 restricted to axial region ΔZ supporting efficient radial emission 105.

Figure 12B:
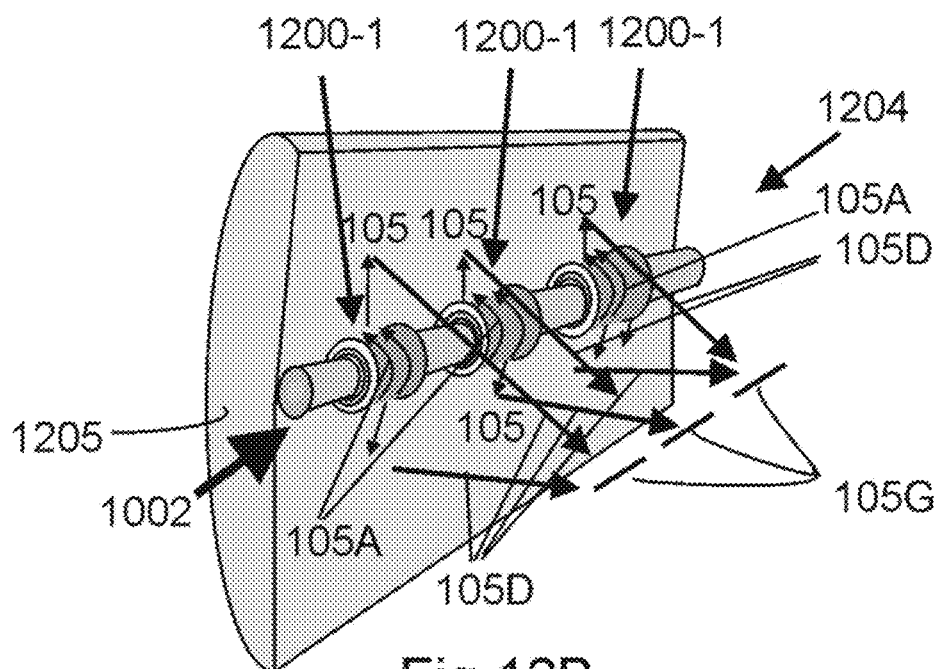
FIG. 12*b* shows a schematic of a multi-element solid-state cylindrical ring laser array with non-uniform axial structure as related to FIG. 12A housed within a three-dimensional reflection mirror to redirect and concentrate the circumferential radial laser emission in accordance with an embodiment of the present invention.

FIG. 12B shows a multi-element solid-state cylindrical ring laser 1204 featuring multiple laser elements of type 1200 with elements with layer configuration given by cross section S1 stacked along a common core region with layers illustrated along section S2 according to an embodiment of the invention. Optical pump radiation 1002 is provided by one or more independent optical sources ether free space or fiber coupled directed to overlap with the gain media to form a gain confining region in accordance with this disclosure. Optical pumping can be achieved in all directions, front, back and side to optimize pump absorption in the gain tailored confining region. The central region may be hollow enabling liquid coolant 1003 to flow through the structure for heat removal. The individual laser elements 1200-1, 1200-2, 1200-3 are configured to produce independent efficient radial emission. The radial emission 105 of the laser elements 1200-1, 1200-2, 1200-3, are reflected by a three dimensional mirror 1205 for redirecting the radial emission 105D and concentrating the circumferential laser emission to concentrated line segments 105G, or alternatively collimating the laser emission with a parabolic mirror (not shown).

Figure 13:
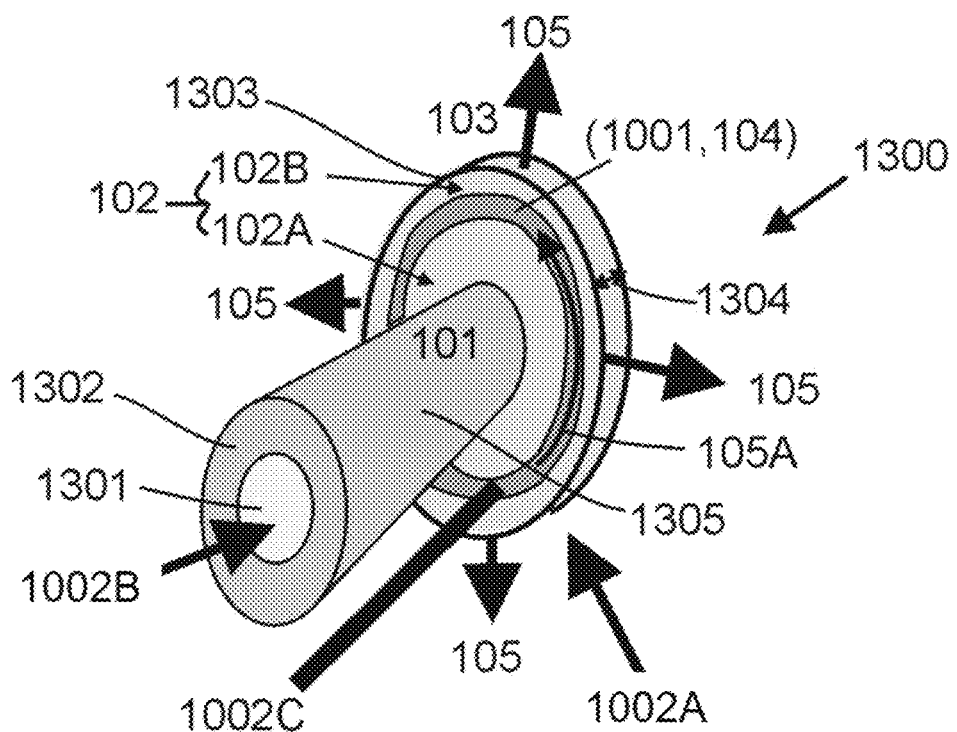
FIG. 13 shows a schematic of a solid-state cylindrical ring laser with a disk geometry positioned at the distal end of an optical fiber in accordance with an embodiment of the present invention.

FIG. 13 shows an embodiment of a solid-state cylindrical ring laser 1300 with a thin gain and index guided microcylindrical ring disk resonator 1303 formed at the distal end of an optical fiber 1305 with inner core 1301 and cladding layer 1302 according to an embodiment of the invention. The cylindrical ring waveguide comprises regions 101, 102 (102A, 102B) and 103, with index of refraction of region 102 greater than that of region 101 and region 103. Region 102 contain an optically active gain media 1001. Optical pump radiation consists of one or more independent optical sources which can be fiber coupled 1002C or free space 1002A or light coupled 1002B down the core 1301 of the central optical fiber 1305. The overlap of the gain media 1001 and pump radiation established a gain confining region 104 within region 102 restricted to smaller radii than outside radius of the cylindrical ring waveguide to favor amplification of preferred set of a radial modes. The disk thickness 1304 is tailored to support one or more axial modes. The laser emits efficient radial emission 105 upon sufficient optical pump radiation.

Figure 14:
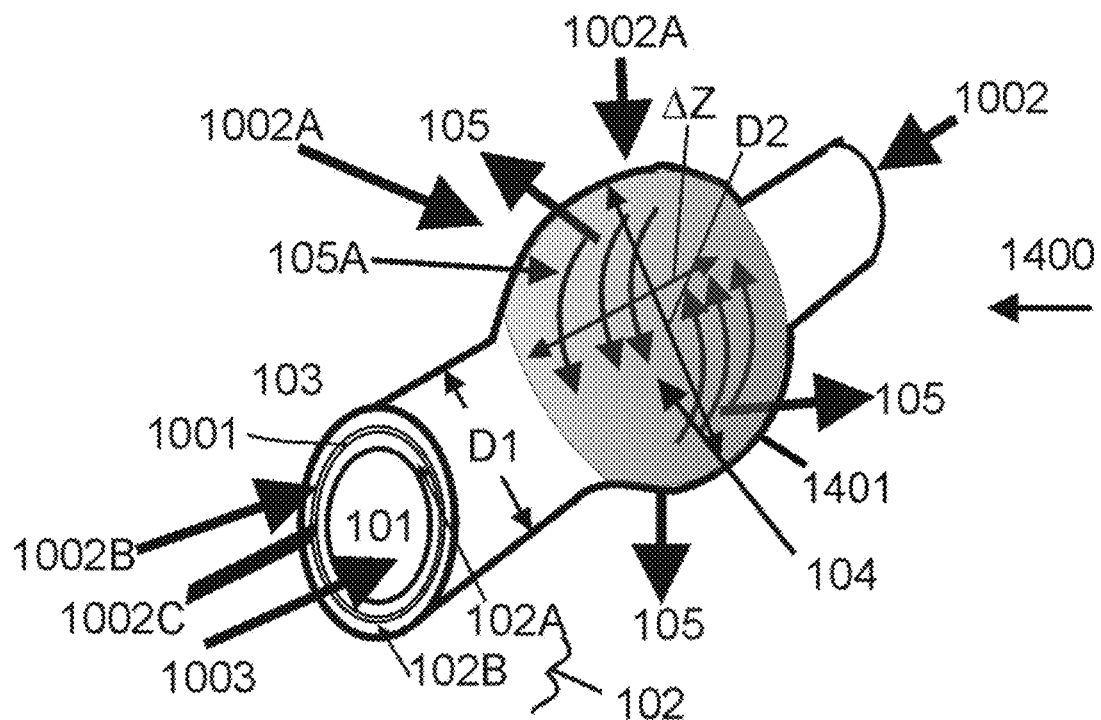
FIG. 14 shows a schematic of a multi-layered cylindrical ring laser with a bottle type waveguide geometry, thereby providing axial confinement limiting the number of axial modes in accordance with the present disclosure.

FIG. 14 shows a cylindrical ring solid state laser device 1400 featuring a bottle-type cylindrical ring resonator 1401 providing axial modal confinement formed from a multi-layered cylindrical ring waveguide defined by regions 101, 102, 103 confining a set of optical modes with radial, azimuthal and axial components according to an embodiment of the invention. The bottle-type resonator geometry consists of an axially varying cylindrical ring waveguide diameter increasing from D1 to D2 back to D1 over an axial distance ΔZ forming an axial waveguide confining one or more axial modes. A gain layer 1001 is housed within cylindrical waveguide region 102 (102A and 102B) which is overlapped with an optical pump source 1002 to form a gain confining region 104 within the bottle axial waveguide region ΔZ. Optical pump radiation 1002 is provided by one or more independent optical sources ether free space 1002A, 1002B (coupled and propagating down the central core region) or fiber coupled 1002C sources. The central region may be hollow enabling liquid coolant 1003 to flow through the structure for heat removal, or the central region may be a solid. The radial and azimuthal modes are selected by the gain confining region to support efficient radial laser emission 105 upon sufficient pump actuation.

The foregoing description of the various embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Although the description above contains many details and specifics, these should not be construed as limiting the scope of the application but as merely providing illustrations of some of the presently preferred embodiments of the apparatus, systems, and methods. Other implementations, enhancements and variations can be made based on what is described and illustrated in this patent document. The features of the embodiments described herein may be combined in all possible combinations of methods, apparatus, modules and systems. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Therefore, it will be appreciated that the scope of the present application fully encompasses other embodiments which may become obvious to those skilled in the art. In the claims, reference to an element in the singular is not intended to mean "one and only one" unless explicitly so stated, but rather "one or more." All structural and functional equivalents to the elements of the above described embodiments that are known to those of ordinary skill in the art are expressly incorporated herein by reference and are intended to be encompassed by the present claims. Moreover, it is not necessary for a device to address each and every problem sought to be solved by the present apparatus, systems, and methods, for it to be encompassed by the present claims. Furthermore, no element or component in the present disclosure is intended to be dedicated to the public regardless of whether the element or component is explicitly recited in the claims. No claim element herein is to be construed under the provisions of 35 U.S.C. 112, sixth paragraph, unless the element is expressly recited using the phrase "means for."

While the apparatus, systems, and methods may be susceptible to various modifications and alternative forms, specific embodiments have been shown by way of example in the drawings and have been described in detail herein. However, it should be understood that the application is not intended to be limited to the particular forms disclosed. Rather, the application is to cover all modifications, equivalents, and alternatives falling within the spirit and scope of the application as defined by the following appended claims.

What is claimed is:

1. An apparatus comprising:
   a cylindrical ring waveguide having an inner radius and an outer radius;
   at least one gain medium housed within the cylindrical ring waveguide; and
   at least one pump source;
   wherein the cylindrical ring waveguide is configured to support a plurality of modes;
   wherein the pump source is configured to provide pump power that overlaps with the gain medium to provide increased optical gain within a gain confining region relative to any optical gain outside the gain confining region; and
   wherein the gain confining region is limited in radial extent with an outer radius less than the outer radius of the cylindrical ring;
   waveguide to favor amplification of one or more selected modes having intensity peaks inside the outer radius of the gain confining region over other modes having a lower overlap with the gain confining region than the selected modes.

2. The apparatus of claim 1
   wherein the cylindrical ring waveguide includes distributed Bragg reflectors configured to reflect a subset of modes.

3. The apparatus of claim 1
   wherein the cylindrical ring waveguide includes an optical coating applied to one or more surfaces of the cylindrical ring waveguide.

4. The apparatus of claim 1
   wherein the apparatus is configured as a light emitting diode by limiting a power level of the pump source below an associated laser threshold.

5. The apparatus of claim 2
   an external three-dimensional reflector configured to redirect circumferential radial emission emanating from the selected modes in at least one of the azimuthal or axial direction.

6. The apparatus of claim 5
   wherein the external three-dimensional reflector is a conical mirror.

7. The apparatus of claim 1
   wherein the cylindrical ring waveguide includes multiple concentric cylindrical ring waveguides positioned one inside the other with independent pump sources capable of supporting independent radial emission.

8. The apparatus of claim 1
   wherein the cylindrical ring waveguide includes multiple concentric cylindrical ring waveguides stacked in the axial direction with independent pump sources capable of supporting independent radial emission.

9. The apparatus of claim 1
   wherein the cylindrical ring waveguide is configured larger in dimension than 10 times the largest optical wavelength supported by the plurality of modes.

10. The apparatus of claim 1
    wherein the cylindrical ring waveguide is configured smaller in dimension than 10 times the largest optical wavelength supported by the plurality of modes.

11. The apparatus of claim 1
    wherein the cylindrical ring waveguide is cooled by coolant configured to flow externally to the cylindrical ring waveguide.

12. The apparatus of claim 1
    wherein the cylindrical ring waveguide is positioned at the distal end of an optical fiber configured as the pump source to provide the pump power as optical pump radiation.

13. The apparatus of claim 1
    wherein the cylindrical ring waveguide is composed of solid-state
    wherein the gain region is doped with at least one item selected from the group consisting of: a rare-Earth metal, and a transition metal.

14. The apparatus of claim 1
    wherein the cylindrical ring waveguide is configured as at least one item selected from the group consisting of: a bottle-shaped waveguide, and a disk-shaped waveguide.

15. The apparatus of claim 1 further comprising:
    wherein the cylindrical ring optical resonator is a cylindrical ring waveguide is formed in a multi: layered semiconductor epitaxial medium comprising multiple epitaxial layers;
    the epitaxial layers configured to provide conduction pathways, an axial waveguide containing at least one or more axial modes and the gain medium;
    wherein the gain medium is configured to form one or more active layers alternatively stacked in the axial dimension between at least first and second layers;
    wherein the at least first and second layers include one of a p-type or n-type dopant, each layer containing a dopant of a type opposite the other; and,
    electrical contacts configured to inject electrical current as the provided pump power sufficient to generate photons within the one or more active layers restricted to the gain confining region; and, the gain confining region limited in radial and azimuthal dimensions to selectively amplify a subset of modes supporting radial emission.

16. The apparatus of claim 15
wherein the gain confining region is defined by the spatial profile of the current injected into the one or more active layers; and the active layer is further configured to spatially localize optical gain to overlap with a subset of modes favoring radial emission.

17. The apparatus of claim 15
wherein the gain confining region is limited to the current injection and associated photon generation regions within the active layer defined by the geometric extent of the electrical contacts configured to spatially limit the injected current and photon generation within the active layer to regions which overlap and amplify a subset of modes supporting radial emission.

18. The apparatus of claim 15
wherein the gain confining region is defined by a plurality of conductive pathways extending in the axial direction configured to spatially limit the injected current and photon generation within the active layer thereby limiting optical gain to regions within the active layer which amplify a subset of modes supporting efficient radial emission.

19. The apparatus of claim 15
wherein the cylindrical ring waveguide includes a series of distributed attenuation lines extending in the axial direction of limited radial and axial extent, thereby creating regions of optical loss for offsetting modal gains of traveling wave modes favoring amplification of a subset of modes supporting efficient radial emission.

20. The apparatus of claim 15
wherein the gain confining region is limited to current injection regions within the active layer defined by the volumetric extent of the doped layers.

21. The apparatus of claim 15
wherein the cylindrical ring waveguide is configured in the form of a multi-layered ridge waveguide structure.

22. The apparatus of claim 15
wherein the cylindrical ring waveguide is configured in the form of a multi-layered buried waveguide structure.

23. The apparatus of claim 1
wherein the apparatus is configured as a laser by exceeding a power level of the pump source above an associated laser threshold.

24. The apparatus of claim 1
wherein the gain confining region is limited in radial extent with an inner radius greater than the inner radius of the cylindrical ring waveguide.

25. The apparatus of claim 1
wherein the gain confining region varies in the azimuthal dimension and comprises multiple segments positioned around the azimuthal dimension of the cylindrical ring waveguide.

26. The apparatus of claim 1
wherein the cylindrical ring waveguide includes a plurality of regions forming a multi-step index profile varying in the radial dimension.

27. The apparatus of claim 1
wherein the pump source is configured to provide the pump power by free-space radiation.

28. The apparatus of claim 1
wherein the pump source is configured to provide the pump power by at least one optical waveguide, or at least one optical fiber.

29. The apparatus of claim 1
wherein the pump source is configured to provide the pump power by an electrical current.

30. A method of making an apparatus comprising:
providing a cylindrical ring waveguide having an inner radius and an outer radius;
providing at least one gain medium housed within the cylindrical ring waveguide;
providing at least one pump source;
configuring the cylindrical ring waveguide to support a plurality of modes;
configuring the pump source to provide pump power that overlaps with the gain medium to provide increased optical gain within a gain confining region relative to any optical gain outside the gain confining region; and
limiting the gain confining region in radial extent with an outer radius less than the outer radius of the cylindrical ring waveguide to favor amplification of one or more selected modes having intensity peaks inside the outer radius of the gain confining region over other modes having a lower overlap with the gain confining region than the selected modes.

31. The method of claim 30 further comprising:
providing an external reflective surface configured to reflect emitted radiation in a direction different from a radial emission emanating from the selected modes.

32. The method of claim 30 further comprising:
applying optical coatings to one or more surfaces of the cylindrical ring waveguide.

33. The method of claim 30 further comprising:
forming the cylindrical ring waveguide in a multi-layered semiconductor epitaxial medium comprising multiple epitaxial layers;
configuring the epitaxial layers to provide conduction pathways, an axial waveguide containing at least one or more axial modes and the gain medium;
configuring the gain medium to form one or more active layers alternatively stacked in the axial dimension between at least first and second layers;
doping the at least first and second layers to include one of a p-type or n-type dopant, each layer containing a dopant of a type opposite the other; and,
configuring electrical contacts to inject electrical current as the provided pump power sufficient to generate photons within the one or more active layers restricted to the gain confining region; and,
limiting the gain confining region in radial and azimuthal dimensions to selectively amplify a subset of modes supporting circumferential radial emission.

34. The method of claim 33 further comprising:
producing optical gain in the one or more active layers by providing top and bottom electrical contacts and current pathways configured to allow current flow through the stacked layers with radiative recombination taking place within the one or more active layers within the gain confining regions.

35. The method of claim 33 further comprising:
providing a modal gain difference by limiting the geometric extent in the radial and azimuthal dimensions of injected carriers into the one or more active layers to regions which substantially overlap with intensity profiles of a select subset of modes, while not providing current to regions which substantially overlap with the remainder of the plurality of modes.

36. The method of claim 33 further comprising:
providing an output pathway for the circumferential radial emission by etching a cylindrical trench into a semiconductor layer;
wherein the cylindrical trench extends in the axial dimension at a radius greater than or equal to the outer radius of the cylindrical ring waveguide thereby exposing an active layer surface.

37. The method of claim 30 further comprising:
forming the cylindrical ring waveguide from at least one solid state medium;
doping the gain medium with at least one item selected from the group consisting of: a rare-earth metal, and a transition metal.

38. The method of claim 37 further comprising:
wherein providing cylindrical ring waveguide includes providing a multi-layered cylindrical medium comprising multiple layers configured to provide optical confinement in the radial direction with each layer formed by a solid-state medium of annular ring geometry positioned concentrically one inside another extending in axial dimension.

39. A method of operating an apparatus comprising:
pumping, using a pump source, at least one gain medium housed within a cylindrical ring waveguide that has an inner radius and an outer radius, wherein the cylindrical ring waveguide is configured to support a plurality of modes;
operating the pump source to provide pump power that overlaps with the gain medium to provide increased optical gain within a gain confining region relative to any optical gain outside the gain confining region; and
limiting the gain confining region in radial extent with an outer radius less than the outer radius of the cylindrical ring waveguide to favor amplification of one or more selected modes having intensity peaks inside the outer radius of the gain confining region over other modes having a lower overlap with the gain confining region than the selected modes.

40. An apparatus comprising:
a cylindrical ring waveguide having an inner radius and an outer radius;
at least one gain medium housed within the cylindrical ring waveguide; and
at least one pump source;
wherein the cylindrical ring waveguide is configured to support a plurality of modes;
wherein the cylindrical ring waveguide is configured larger in dimension than 10 times the largest optical wavelength supported by the plurality of modes;
wherein the pump source is configured to provide pump power that overlaps with the gain medium to provide increased optical gain within a gain confining region relative to any optical gain outside the gain confining region; and
wherein the gain confining region is limited in radial extent with an outer radius less than the outer radius of the cylindrical ring waveguide to favor amplification of one or more selected modes over other modes.

* * * * *